(12) United States Patent
Mizutani et al.

(10) Patent No.: US 7,160,666 B2
(45) Date of Patent: *Jan. 9, 2007

(54) PHOTOSENSITIVE RESIN COMPOSITION

(75) Inventors: Kazuyoshi Mizutani, Shizuoka (JP); Shinichi Kanna, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 190 days.

This patent is subject to a terminal disclaimer.

(21) Appl. No.: 10/378,920

(22) Filed: Mar. 5, 2003

(65) Prior Publication Data
US 2003/0203308 A1 Oct. 30, 2003

(30) Foreign Application Priority Data
Mar. 6, 2002 (JP) .......................... P. 2002-060756

(51) Int. Cl.
G03C 1/73 (2006.01)
G03F 7/039 (2006.01)

(52) U.S. Cl. .................. 430/270.1; 430/907; 430/914; 430/909; 430/910; 430/921; 430/925; 430/326

(58) Field of Classification Search ............. 430/270.1, 430/326, 914, 921, 925, 907, 909, 910
See application file for complete search history.

(56) References Cited

U.S. PATENT DOCUMENTS

| | | | | |
|---|---|---|---|---|
| 6,461,791 | B1 * | 10/2002 | Hatakeyama et al. | 430/270.1 |
| 6,593,058 | B1 * | 7/2003 | Feiring et al. | 430/270.1 |
| 6,610,456 | B1 * | 8/2003 | Allen et al. | 430/270.1 |
| 6,811,947 | B1 * | 11/2004 | Mizutani et al. | 430/270.1 |
| 2003/0224285 | A1 * | 12/2003 | Nakao et al. | 430/270.1 |
| 2004/0033438 | A1 * | 2/2004 | Hamada et al. | 430/270.1 |
| 2004/0175645 | A1 * | 9/2004 | Sasaki et al. | 430/270.1 |

FOREIGN PATENT DOCUMENTS

| | | |
|---|---|---|
| EP | 0 898 201 A1 * | 2/1999 |
| EP | 1 179 750 A1 * | 2/2002 |
| WO | WO 00/17712 A1 | 3/2000 |
| WO | WO 01/74916 A1 | 10/2001 |

OTHER PUBLICATIONS

Dirk Schmaljohann et al., Design Strategies for 157 nm Single-Layer Photoresists: Lithographic Evaluation of a Poly($\alpha$-trifluoromethyl vinyl alcohol) Copolymer, Advances in Resist Technology and Processing XVII, .F.M. Houlikan, Editor, Proceedings of SPIE vol. 3999 (2000), pp. 330-334.

Michael K. Crawford et al., New Materials for 157 nm Photoresists: Characterization and Properties, Advances in Resist Technology and Processing XVII, .F.M. Houlikan, Editor, Proceedings of SPIE vol. 3999 (2000), pp. 357-364.

Kyle Patterson et al., Polymers for 157 nm Photoresist Applications: A Progress Report, Advances in Resist Technology and Processing XVII, .F.M. Houlikan, Editor, Proceedings of SPIE vol. 3999 (2000), pp. 365-374.

* cited by examiner

Primary Examiner—Sin Lee
(74) Attorney, Agent, or Firm—Sugimue Mion, PLLC

(57) ABSTRACT

A photosensitive resin composition of the present invention comprises (A) a resin having a repeating unit represented by formula (IA) and a repeating unit containing an acid decomposable group and copolymerizable with formula (IA), which is decomposed under the action of an acid to increase the solubility in an alkali developer, (B1) a compound capable of generating an aliphatic or aromatic sulfonic acid substituted by at least one fluorine atom upon irradiation with actinic rays or radiation, (B2) a compound capable of generating an aliphatic or aromatic sulfonic acid containing no fluorine atom, or an aliphatic or aromatic carboxylic acid upon irradiation with actinic rays or radiation, and (C) a solvent.

10 Claims, No Drawings

PHOTOSENSITIVE RESIN COMPOSITION

FIELD OF THE INVENTION

The present invention relates to a photosensitive resin composition suitable for use in the microlithography process at the production of VLSI or high-capacity microchip, or other photo-fabrication processes. More specifically, the present invention relates to a positive resist composition capable of forming a highly refined pattern using vacuum ultraviolet light a wavelength of 160 nm or less.

BACKGROUND OF THE INVENTION

The integration degree of integrated circuits is more and more increasing and in the production of a semiconductor substrate of VLSI or the like, an ultrafine pattern comprising lines having a width of half-micron or less must be processed. One known method for attaining the refinement of pattern is to use an exposure light source having a short wavelength at the formation of a resist pattern.

For example, in the production of a semiconductor device having an integration degree up to 64 M bits, the i-line (365 nm) of a high-pressure mercury lamp is used as a light source at present. As the positive resist capable of responding to this light source, a large number of compositions containing a novolak resin and a naphtho-quinonediazide compound as a photosensitive material have been developed and these are sufficiently effective in the processing of a line width up to about 0.3 µm. Also, in the production of a semiconductor device having an integration degree of 256 M bits or more, a KrF excimer laser (248 nm) is used as a light source in place of the i-line.

Furthermore, for the purpose of producing a semiconductor having an integration degree of 1 G bits or more, studies are being recently made on use of a light source having a further shorter wavelength, that is, an ArF excimer laser (193 nm) or in order to form a pattern of 0.1 µm or less, an $F_2$ excimer laser (157 nm).

To cope with this tendency to shorter wavelength of the light source, the constituent components of the resist material and the compound structure thereof are also greatly changing.

As a resist composition for exposure by a KrF excimer laser, a composition where a resin with the basic skeleton being poly(hydroxystyrene) having small absorption in the region of 248 nm and protected by an acid decomposable group is used as the main component and this is combined with a compound capable of generating an acid upon irradiation with far ultraviolet ray, a so-called chemical amplification-type resist, has been developed.

Also, as the resist composition for exposure by an ArF excimer laser (193 nm), a chemical amplification-type resist using an acid decomposable resin where an alicyclic structure having no absorption at 193 nm is introduced into the main or side chain of the polymer has been developed.

However, for the $F_2$ excimer laser ray (157 nm), this alicyclic resin shows large absorption in the region of 157 nm and is found insufficient for obtaining an objective pattern of 0.1 µm or less. On the other hand, a resin having introduced thereinto a fluorine atom (perfluoro structure) has been reported to have sufficiently high transparency to light at 157 nm in *Proc. SPIE.*, Vol. 3678, page 13 (1999) and effective fluororesin structures are proposed in *Proc. SPIE.*, Vol. 3999, pages 330, 357 and 365 (2000) and WO-00/17712. Thus, studies are being made on the resist composition containing a fluorine-containing resin.

However, the fluororesin-containing resist composition for exposure by an $F_2$ excimer laser has a problem such as line edge roughness or development time dependency and is demanded to be improved in these points.

The "line edge roughness" means a shape such that due to the characteristics of resist, the edge at the interface between the line pattern of resist and the substrate is irregularly fluctuated in the direction perpendicular to the line direction. When this pattern is viewed from right above, irregularities (on the order of ±a few nm to tens of nm) are observed on the edge. These irregularities are transferred to the substrate in the etching step and if the irregularities are large, electrical characteristic failure is brought about and this decreases the yield.

The "development time dependency" means the degree of change in the pattern dimension due to the fluctuation of development time. If the development time dependency is large, the dimensional uniformity in the wafer plane is worsened and the process becomes hard to control.

SUMMARY OF THE INVENTION

Accordingly, an object of the present invention is to provide a photosensitive resin composition suitable for use with an exposure light source of 160 nm or less, particularly an $F_2$ excimer laser (157 nm). More specifically, the object of the present invention is to provide an excellent photosensitive resin composition showing sufficiently high transparency on use of a light source of 157 nm and reduced in the light edge roughness and development time dependency.

As a result of extensive investigations by taking account of the above-described various properties, the present inventors have found that the object of the present invention can be successfully attained by use of the following specific composition. The present invention has been accomplished based on this finding.

That is, the present invention has the following construction.

(1) A photosensitive resin composition comprising:

(A) a resin capable of decomposing by the action of an acid to increase solubility in an alkali developer, the resin having:
    a repeating unit represented by formula (IA) below; and
    a repeating unit containing an acid decomposable group and copolymerizable with the repeating unit represented by formula (IA);

(B1) a compound capable of generating an aliphatic or aromatic sulfonic acid upon irradiation with actinic rays or radiation, in which the aliphatic or aromatic sulfonic acid is substituted by at least one fluorine atom;

(B2) a compound capable of generating one of an aliphatic sulfonic acid, an aromatic sulfonic acid, an aliphatic carboxylic acid and an aromatic carboxylic acid upon irradiation with actinic rays or radiation, in which each of the aliphatic sulfonic acid and the aromatic sulfonic acid contains no fluorine atom; and (C) a solvent:

(IA)

wherein $R_1a$ to $R_1d$ each independently represents a hydrogen atom, a fluorine atom, an alkyl group, an alkyl group in which at least one hydrogen atom is substituted by a fluorine atom, a perfluoroalkyl group, a cycloalkyl group, an aryl group, —OR', —CO$_2$R' or —CONHR', R' represents an alkyl group, an alkyl group in which at least one hydrogen atom is substituted by a fluorine atom, a perfluoroalkyl group, a cycloalkyl group, an aryl group or an aralkyl group, and at least one of $R_1a$ to $R_1d$ represents a fluorine atom or an alkyl group in which at least one hydrogen atom is substituted by a fluorine atom.

(2) The photosensitive resin composition as described in the item (1), wherein the resin (A) is a resin capable of decomposing by the action of an acid to increase solubility in an alkali developer, the resin having:

the repeating unit represented by formula (IA); and a repeating unit represented by formula (IIA') below, in which the repeating unit contains an acid decomposable group and copolymerizable with the repeating unit represented by formula (IA):

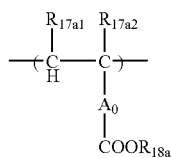

(IIA')

wherein $R_{17a1}$ and $R_{17a2}$, which may be the same or different, each represents a hydrogen atom, a halogen atom, a cyano group or an alkyl group which may have a substituent, $R_{18a}$ represents a hydrogen atom, —C($R_{16a1}$)($R_{18a2}$)($R_{18a3}$) or —C($R_{18a1}$)($R_{18a2}$)(OR$_{18a4}$), wherein $R_{18a1}$ to $R_{18a4}$, which may be the same or different, each represents an alkyl, cycloalkyl, alkenyl, aralkyl or aryl group, each of which may have a substituent, and two of $R_{18a1}$, $R_{18a2}$ and $R_{18a3}$ or two of $R_{18a1}$, $R_{18a2}$ and $R_{18a4}$ may combine to form a ring, $A_0$ represents a single bond or a divalent linking group which may have a substituent, and $A_0$ and $R_{17a1}$ may combine to form an alicyclic group.

(3) The photosensitive resin composition as described in the item (1), wherein the resin (A) further comprises a repeating unit represented by formula (IIA):

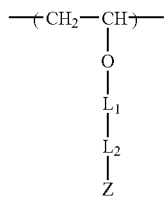

(IIA)

wherein Z represents an alkyl, aryl or aralkyl group, in which the alkyl, aryl or aralkyl group may have a substituent, $L_1$ represents a single bond or alkylene group, and $L_2$ represents a single bond, an alkylene group, —O—, —CO—, —CO$_2$—, —S—, —SO—, —SO$_2$— or a divalent group containing at least two of those groups, and when $L_1$ represents a single bond, $L_2$ represents a single bond or an alkylene group.

(4) The photosensitive resin composition as described in the item (1), wherein the repeating unit represented by formula (IA) includes at least one of repeating units represented by the following formulae (I) to (III):

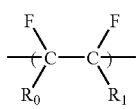

(I)

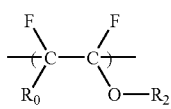

(II)

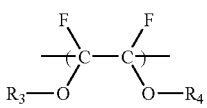

(III)

wherein $R_0$ and $R_1$ each independently represents a hydrogen atom, a fluorine atom, an alkyl group which may have a substituent, an alkyl group in which at least one hydrogen atom is substituted by a fluorine atom, which may have a substituent, a perfluoroalkyl group which may have a substituent, a cycloalkyl group which may have a substituent, or an aryl group which may have a substituent, $R_2$ to $R_4$ each independently represents an alkyl group in which at least one hydrogen atom is substituted by a fluorine atom, which may have a substituent, an alkyl group which may have a substituent, a perfluoroalkyl group which may have a substituent, a cycloalkyl group which may have a substituent, or an aryl group which may have a substituent, $R_0$ and $R_1$, $R_0$ and $R_2$, or $R_3$ and $R_4$ may combine to form a ring.

(5) The photosensitive resin composition as described in the item (1), wherein the compound (B1) includes one of an iodonium salt represented by the following formula (PAG3) and a sulfonium salt represented by formula (PAG4):

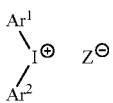

(PAG3)

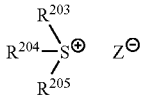

(PAG4)

wherein Ar$^1$ and Ar$^2$ each independently represents a substituted or unsubstituted aryl group, $R^{203}$, $R^{204}$ and $R^{205}$ each independently represents a substituted or unsubstituted alkyl group or a substituted or unsubstituted aryl group, $Z^-$ represents a sulfonate anion having at least one fluorine atom, and two of $R^{203}$, $R^{204}$ and $R^{205}$, or Ar$^1$ and Ar$^2$ may combine through a single bond or a substituent.

(6) The photosensitive resin composition as described in the item (1), wherein the weight ratio of the compound (B1) and the compound (B2) added is from 1/1 to 50/1.

(7) The photosensitive resin composition as described in the item (1), which further comprises (D) a surfactant.

(8) The photosensitive resin composition as described in the item (1), which further comprises a nitrogen-containing basic compound.

DETAILED DESCRIPTION OF THE INVENTION

The compounds for use in the present invention are described in detail below.

[1] Resin (Also Referred to as "Component (A)")

Examples of the resin of the component (A) for use in the present invention include at least one repeating unit represented by formula (IA) and at least one repeating unit containing an acid decomposable group and copolymerizable with formula (IA).

In formula (IA), $R_1a$ to $R_1d$ each independently represents a hydrogen atom, a fluorine atom, an alkyl group, an alkyl group with at least one hydrogen atom being substituted by a fluorine atom, a perfluoroalkyl group, a cycloalkyl group, an aryl group. —OR', —$CO_2R'$ or —CONHR'. R' represents an alkyl group, an alkyl group with at least one hydrogen atom being substituted by a fluorine atom, a perfluoroalkyl group, a cycloalkyl group, an aryl group or an aralkyl group.

However, at lest one of $R_1a$ to $R_1d$ represents a fluorine atom or an alkyl group with at least one hydrogen atom being substituted by a fluorine atom.

The alkyl group in $R_1a$ to $R_1d$ and R' is, for example, an alkyl group having from 1 to 8 carbon atoms and specific preferred examples thereof include a methyl group, an ethyl group, a propyl group, an n-butyl group, a sec-butyl group, a hexyl group, a 2-ethylhexyl group and an octyl group. These groups each may further have a substituent.

The perfluoroalkyl group in $R_1a$ to $R_1d$ and R' is, for example, a perfluoroalkyl group having from 4 to 12 carbon atoms and specific preferred examples thereof include a trifluoromethyl group, a pentafluoroethyl group, a perfluorobutyl group, a perfluorohexyl group, a perfluorooctyl group, a perfluorooctylethyl group and a perfluorododecyl group.

The cycloalkyl group in $R_1a$ to $R_1d$ and R' may be monocyclic or polycyclic or may have a substituted.

The monocyclic cycloalkyl group is a cycloalkyl group having from 3 to 8 carbon atoms and preferred examples thereof include a cyclopropyl group, a cyclopentyl group, a cyclohexyl group, a cycloheptyl group and a cyclooctyl group. The polycyclic cycloalkyl group is a cycloalkyl group having from 6 to 20 carbon atoms and preferred examples thereof include an adamantyl group, a norbornyl group, an isoboronyl group, a camphornyl group, a dicyclopentyl group, an α-pinel group, a tricyclodecanyl group, a tetracyclododecyl group and androstanyl group. In these monocyclic or polycyclic cycloalkyl group, the carbon atom may be substituted by a heteroatom such as oxygen atom.

The aryl group in $R_1a$ to $R_1d$ and R' is, for example, an aryl group having from 6 to 15 carbon atoms and specific preferred examples thereof include a phenyl group, a tolyl group, a dimethylphenyl group, a 2,4,6-trimethylphenyl group, a naphthyl group, an anthryl group and a 9,10-dimethoxyanthryl group. These groups each may further have a substituent.

The aralkyl group in R' is, for example, an aralkyl group having from 7 to 12 carbon atoms and specific preferred examples thereof include a benzyl group, a phenethyl group and a naphthylmethyl group. These groups each may further have a substituent.

Examples of the substituent substituted to these groups include those having active hydrogen such as alkyl group, cycloalkyl group, aryl group, amino group, amido group, ureido group, urethane group, hydroxyl group and carboxyl group, a halogen atom (e.g., fluorine, chlorine, bromine, iodine), an alkoxy group (e.g., methoxy, ethoxy, propoxy, butoxy), a thioether group, an acyl group (e.g., acetyl, propanoyl, benzoyl), an acyloxy group (e.g., acetoxy, propanoyloxy, benzoyloxy), an alkoxycarbonyl group (e.g., methoxycarbonyl, ethoxycarbonyl, propoxycarbonyl), a cyano group and a nitro group.

The alkyl group and the aryl group include those described above but the alkyl group may be further substituted by a fluorine atom or a cycloalkyl group.

In formula (IA), at least one of $R_1a$ to $R_1d$ represents a fluorine atom or an alkyl group with at least one hydrogen atom being substituted by a fluorine atom. In the alkyl group with at least one hydrogen atom being substituted by a fluorine atom, the number of carbon atoms is from 1 to 20, preferably from 1 to 6, more preferably from 1 to 3.

In the present invention, specific examples of the repeating unit represented by formula (IA) include the repeating units represented by the following formulae (I) to (III):

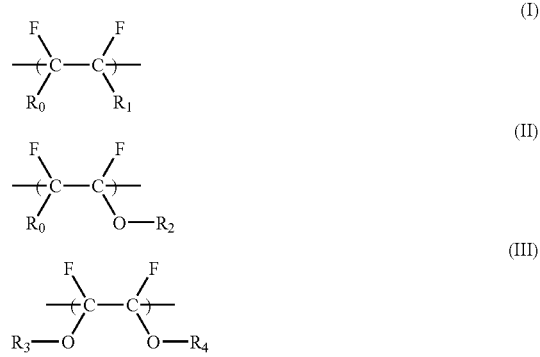

wherein $R_0$ and $R_1$ each represents a hydrogen atom, a fluorine atom, an alkyl group which may have a substituent, an alkyl group with at least one hydrogen atom being substituted by a fluorine atom, which may have a substituent, a perfluoroalkyl group which may have a substituent, a cycloalkyl group which may have a substituent or an aryl group which may have a substituent, $R_2$ to $R_4$ each represents an alkyl group with at least one hydrogen atom being substituted by a fluorine atom, which may have a substituent, an alkyl group which may have a substituent, a perfluoroalkyl group which may have a substituent, a cycloalkyl group which may have a substituent, or an aryl group which may have a substituent.

$R_0$ and $R_1$, $R_0$ and $R_2$ or $R_3$ and $R_4$ may combine to form a ring.

The details of each substituent in formulae (I) to (II) are the same as those in formula (IA).

The ring formed after $R_0$ and $R_1$, $R_0$ and $R_2$ or $R_3$ and $R_4$ are combined is, for example, a 5-, 6- or 7-membered ring and specific examples thereof include a pentane ring substituted by fluorine, a hexane ring, a furan ring, a dioxonol ring and a 1,3-dioxolane ring.

Specific examples of the repeating structure unit represented by formula (IA) are set forth below, however, the present invention is not limited thereto.

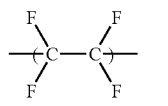
(F-1)

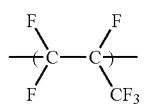
(F-2)

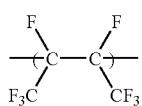
(F-3)

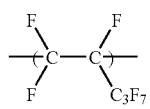
(F-4)

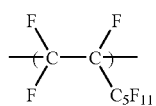
(F-5)

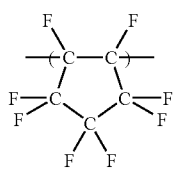
(F-6)

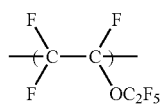
(F-7)

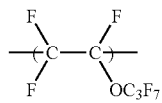
(F-8)

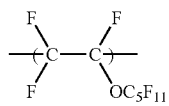
(F-9)

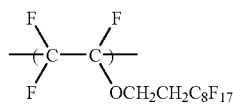
(F-10)

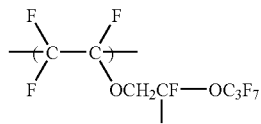
(F-11)

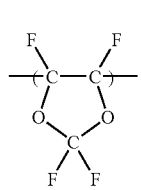
(F-12)

Examples of the group (also referred to as an acid decomposable group) which decomposes under the action of an acid contained in the repeating unit (also referred to as repeating unit (AII)) copolymerizable with formula (IA) having the acid decomposable group and shows alkali solubility include $-O-C(R_{36})(R_{37})(R_{38})$, $-O-C(R_{36})(R_{37})(OR_{39})$, $-O-COO-C(R_{36})(R_{37})(R_{38})$, $-O-C(R_{01})(R_{02})COO-C(R_{36})(R_{37})(R_{38})$, $-COO-C(R_{36})(R_{37})(R_{38})$ and $-COO-C(R_{36})(R_{37})(OR_{39})$.

$R_{36}$ to $R_{39}$ each independently represents an alkyl, cycloalkyl, alkenyl, aralkyl or aryl group which may have the above-described substituent.

$R_{01}$ and $R_{02}$ each represents an alkyl, cycloalkyl, alkenyl, aralkyl or aryl group which may have the above-described substituent.

The details of each substituent in the acid decomposable group are the same as those described above for formula (IA).

The alkenyl group in $R_{36}$ to $R_{39}$, $R_{01}$ and $R_{02}$ is, for example, an alkenyl group having from 2 to 8 carbon atoms and specific preferred examples thereof include a vinyl group, an allyl group, a butenyl group and a cyclohexenyl group.

Specific preferred examples of the acid decomposable group include an ether or ester group of a tertiary alkyl group such as tert-butyl group, tert-amyl group, 1-alkyl-1-cyclohexyl group, 2-alkyl-2-adamantyl group, 2-adamantyl-2-propyl group and 2-(4-methylcyclohexyl)-2-propyl group, an acetal group or acetal ester group such as 1-alkoxy-1-ethoxy group and tetrahydropyranyl group, a tert-alkylcarbonate group and a tert-alkylcarbonyl methoxy group.

The acid decomposable group may be present in other repeating unit in the fluorine-containing resin of the present invention.

In the present invention, the repeating unit (AII) may be any repeating unit as long as it is copolymerizable with formula (IA) containing an acid decomposable group, but examples thereof include a repeating unit represented by the following formula (IIA'):

(IIA')

wherein $R_{17a1}$ and $R_{17a2}$ may be the same or different and each represents a hydrogen atom, a halogen atom, a cyano group or an alkyl group which may have a substituent, in which the halogen atom is preferably a fluorine atom, and the substituent in the alkyl group which may have a substituent preferably is a halogen atom, more preferably a fluorine atom. The alkyl group which may have a substituent is preferably a trifluoroalkyl group.

$R_{18a}$ represents a hydrogen atom, $-C(R_{18a1})(R_{18a2})(R_{18a3})$ or $-C(R_{18a1})(R_{18a2})(OR_{18a4})$, wherein $R_{18a1}$ to $R_{18a4}$ may be the same or different and each represents an alkyl, cycloalkyl, alkenyl, aralkyl or aryl group which may have a substituent, and two of $R_{18a1}$, $R_{18a2}$ and $R_{18a3}$, or two of $R_{18a1}$, $R_{18a2}$ and $R_{18a4}$ may combine to form a ring, and $A_0$ represents a single bond or a divalent linking group which may have a substituent, preferably a single bond, and $A_0$ may combine with $R_{17a1}$ to form an alicyclic group.

The divalent linking group in $A_0$ is a divalent alkylene, cycloalkylene, alkenylene or arylene group which may have a substituent, $-O-CO-R_{22a}-$, $-CO-O-R_{23a}-$ or $-CO-N(R_{24a})-R_{25a}-$.

$R_{22a}$, $R_{23a}$ and $R_{25a}$ may be the same or different and each represents a single bond or a divalent alkylene, alkenylene, cycloalkylene or arylene group which may have an ether group, an ester group, an amido group, a urethane group or a ureido group. $R_{24a}$ represents a hydrogen atom or an alkyl, cycloalkyl, aralkyl or aryl group which may have a substituent.

The ring formed after two of $R_{18a1}$ to $R_{18a3}$ or two of $R_{18a1}$, $R_{18a2}$ and $R_{18a4}$ are combined is preferably a 3-, 4-, 5-, 6-, 7- or 8-membered ring and examples thereof include a cyclopropane ring, a cyclopentane ring, a cyclohexane ring, a tetramethylene oxide ring, a pentamethylene oxide ring, a hexamethylene oxide ring, a furan ring, a pyran ring, a dioxonol ring and a 1,3-dioxolane ring.

The alicyclic group formed after $A_0$ is combined with $R_{17a1}$ may be monocyclic or polycyclic. The monocyclic alicyclic group is an alicyclic group having from 3 to 8 carbon atoms and preferred examples thereof include a cyclopropyl group, a cyclopentyl group, a cyclohexyl group, a cycloheptyl group and a cyclooctyl group.

The polycyclic alicyclic group is an alicyclic group having from 6 to 20 carbon atoms and preferred examples thereof include an adamantyl group, a norbornyl group, an isoboronyl group, a camphornyl group, a dicyclopentyl group, an α-pinel group, a tricyclodecanyl group, a tetracyclododecyl group and androstanyl group.

Examples of the substituent substituted to these groups include those having active hydrogen such as alkyl group, cycloalkyl group, aryl group, amino group, amido group, ureido group, urethane group, hydroxyl group and carboxyl group, a halogen atom (e.g., fluorine, chlorine, bromine, iodine), an alkoxy group (e.g., methoxy, ethoxy, propoxy, butoxy), a thioether group, an acyl group (e.g., acetyl, propanoyl, benzoyl), an acyloxy group (e.g., acetoxy, propanoyloxy, benzoyloxy), an alkoxycarbonyl group (e.g., methoxycarbonyl, ethoxycarbonyl, propoxycarbonyl), a cyano group and a nitro group.

The alkyl group, the cycloalkyl group and the aryl group include those described above but the alkyl group may be further substituted by a fluorine atom or a cycloalkyl group.

Specific examples of the repeating unit (IIA') are set forth below, however, the present invention is not limited thereto.

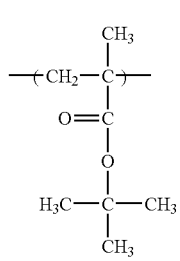

(B-1)

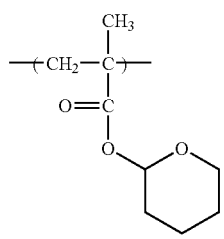

(B-2)

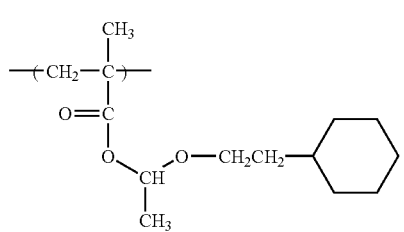

(B-3)

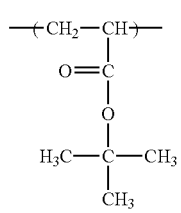

(B-4)

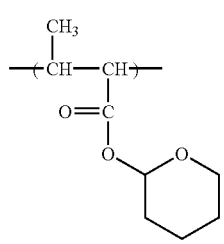

(B-5)

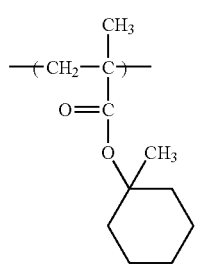

(B-6)

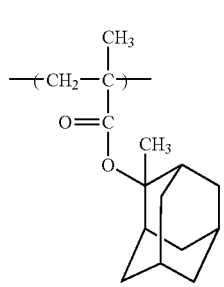

(B-7)

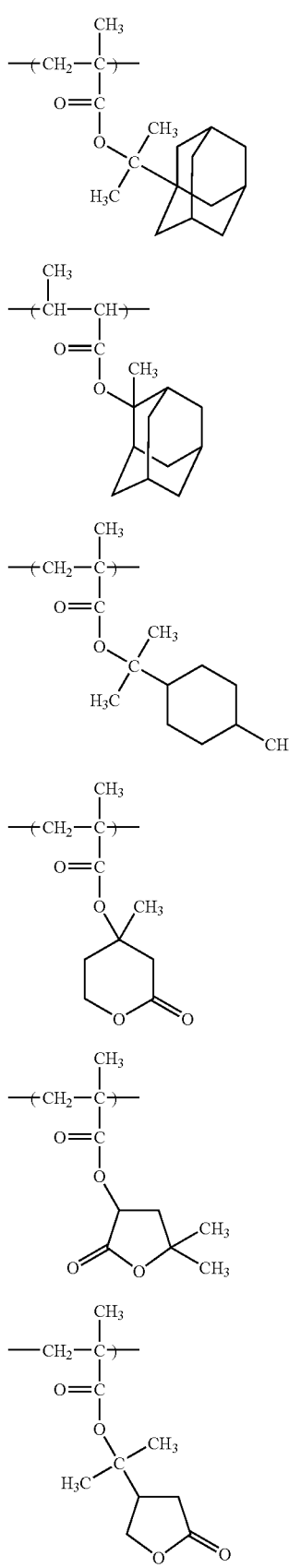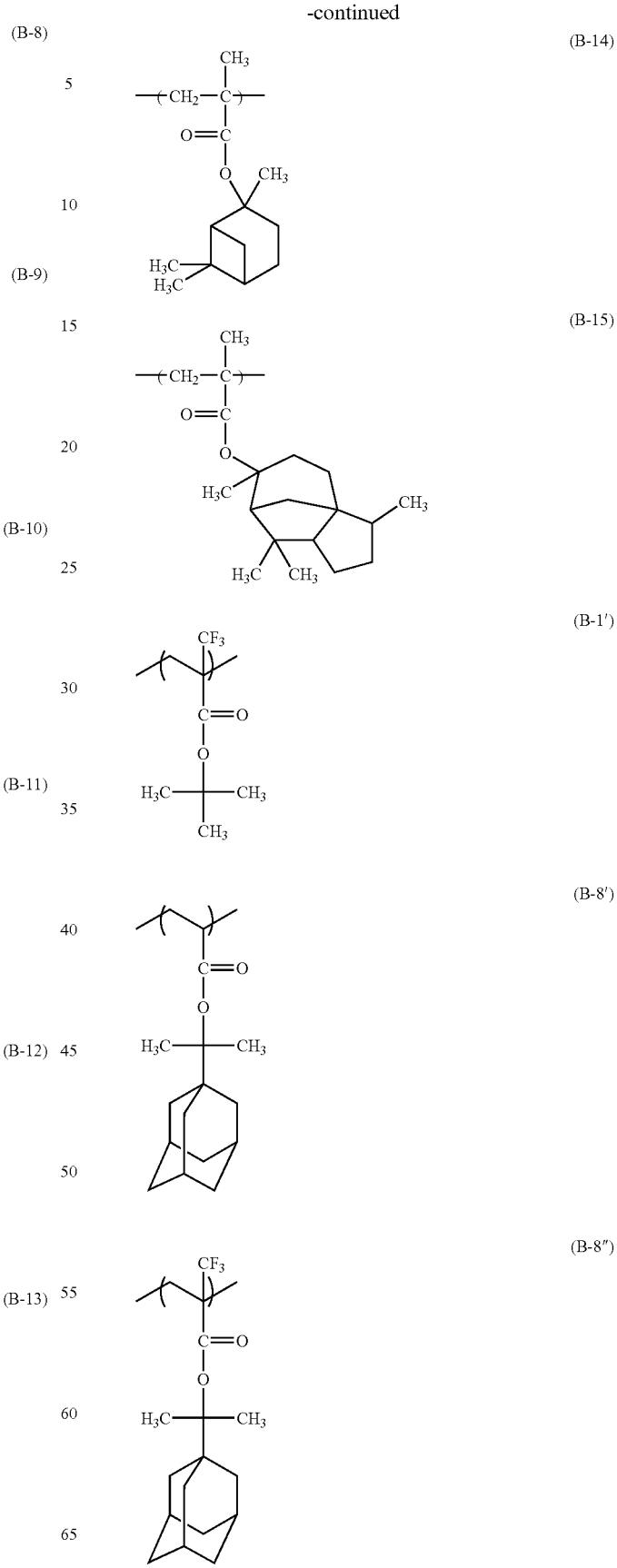

-continued

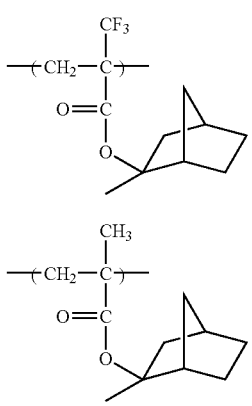

The resin as the component (A) of the present invention preferably further comprises a repeating unit represented by the following formula (IIA):

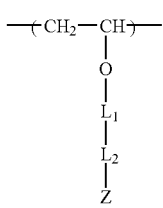

wherein Z represents an alkyl, aryl or aralkyl group, in which the alkyl, aryl or aralkyl group may have a substituent, $L_1$ represents a single bond or alkylene group, and $L_2$ represents a single bond, an alkylene group, —O—, —CO—, —$C_2$—, —S—, —SO—, —$SO_2$— or a divalent group containing at least two of those groups, and when $L_1$ represents a single bond, $L_2$ represents a single bond or an alkylene group.

The alkylene group in $L_1$ and $L_2$ may be a linear or branched, and preferably has from 2 to 10 carbon atoms, more preferably has from 2 to 6 carbon atoms, and examples thereof include ethylene, propylene, butylene, pentylene, hexylene group.

When $L_1$ represents a single bond, $L_2$ preferably represents a single bond.

When $L_1$ represents a alkylene group, $L_2$ preferably represents —O—, —CO—, —$CO_2$—, —S—, —SO— or —$SO_2$—.

The alkyl group in Z is preferably a linear, branched or cyclic alkyl group having from 1 to 10 carbon atoms and examples thereof include a methyl group, an ethyl group, a propyl group, an isopropyl group, a butyl group, an isobutyl group, a tert-butyl group, an amyl group, an isoamyl group, a tert-amyl group, a hexyl group, a heptyl group, an octyl group and a 2-ethyl-hexyl group. Among these, more preferred are a methyl group, an ethyl group, a propyl group and an isopropyl group.

The aryl group in Z is, for example, an aryl group having 6 to 15 carbon atoms and specific preferred examples thereof include a phenyl group, a tolyl group, a dimethylphenyl group, a 2,4,6-trimethylphenyl group, a naphthyl group, an anthryl group and a 9,10-dimethoxyanthryl group. These groups each may further have a substituent.

The aralkyl group in Z is, for example, an aralkyl group having from 7 to 12 carbon atoms and specific preferred examples thereof include a benzyl group, a phenethyl group and a naphthylmethyl group. These groups each may further have a substituent.

The substituent which is further substituted is preferably an alkyl group, a cyano group, a nitro group or a halogen atom, more preferably a fluorine atom or an alkyl group substituted by a fluorine atom.

When Z represents an alkyl group, preferably, $L_1$ represents an alkylene group and $L_2$ represents —O—.

Specific examples of the repeating unit (IIA) are set forth below, however, the present invention is not limited thereto.

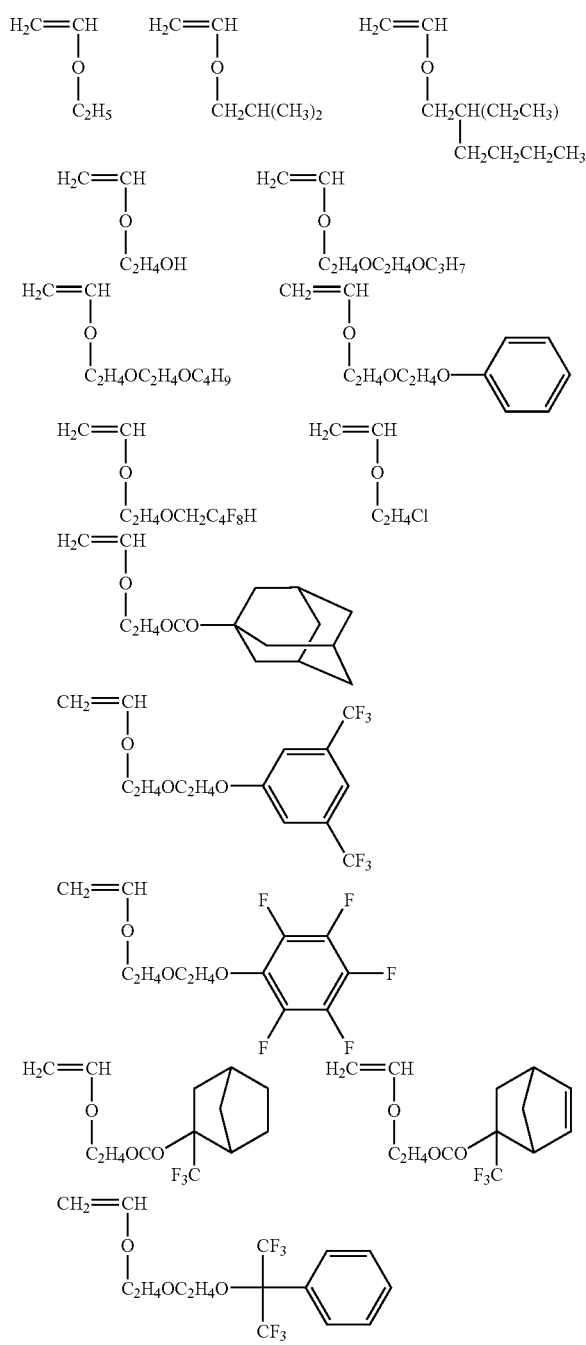

-continued

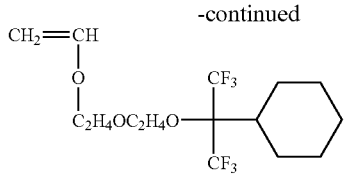

In the fluorine group-containing resin (A) having at least one repeating unit represented by formula (IA) and at least one repeating unit represented by formula (IIA), the content of the repeating unit represented by formula (IA) is generally from 5 to 80 mol %, preferably from 10 to 75 mol %, more preferably from 20 to 70 mol %.

In the fluorine group-containing resin (A) having at least one repeating unit represented by formula (IA) and at least one repeating unit represented by formula (IIA), the content of the repeating unit represented by formula (IIA) is generally from 5 to 80 mol %, preferably from 10 to 70 mol %, more preferably from 20 to 65 mol %.

In the fluorine group-containing resin (A) having at least one repeating unit represented by formula (IA) and at least one repeating unit represented by formula (IIA'), the content of the repeating unit represented by formula (IA) is generally from 5 to 80 mol %, preferably from 10 to 70 mol %, more preferably from 20 to 65 mol %.

In the fluorine group-containing resin (A) having at least one repeating unit represented by formula (IA) and at least one repeating unit represented by formula (IIA'), the content of the repeating unit represented by formula (IIA') is generally from 5 to 80 mol %, preferably from 10 to 70 mol %, more preferably from 20 to 65 mol %.

In the fluorine group-containing resin (A), the content of the repeating unit represented by formula (IIA) is generally from 5 to 80 mol %, preferably from 10 to 70 mol %, more preferably from 15 to 50 mol %.

In addition to those repeating structural units, other polymerizable monomer may be further copolymerized in the resin as the component (A) for use in the present invention so as to improve the performance of the photosensitive resin of the present invention.

Examples of the copolymerization monomer which can be further used in combination include compounds having one addition polymerizable unsaturated bond, selected from acrylic acid esters, acrylamides, methacrylic acid esters, methacrylamides, allyl compounds, vinyl ethers, vinyl esters, styrenes and crotonic acid esters other than those described above.

Specific examples thereof include acrylic acid esters such as alkyl (the alkyl group preferably has from 1 to 10 carbon atoms) acrylates (e.g., methyl acrylate, ethyl acrylate, propyl acrylate, tert-butyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, furfuryl acrylate, tetrahydrofurfuryl acrylate) and aryl acrylates (e.g., phenyl acrylate);

methacrylic acid esters such as alkyl (the alkyl group preferably has from 1 to 10 carbon atoms) methacrylates (e.g., methyl methacrylate, ethyl methacrylate, propyl methacrylate, isopropyl methacrylate, tert-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate) and aryl methacrylate (e.g., phenyl methacrylate, cresyl methacrylate, naphthyl methacrylate);

acrylamides such as acrylamide, N-alkylacrylamides (where the alkyl group has from 1 to 10 carbon atoms, such as methyl group, ethyl group, propyl group, butyl group, tert-butyl group, heptyl group, octyl group, cyclohexyl group, benzyl group and hydroxyethyl group), N-arylacrylamides (examples of the aryl group include a phenyl group, a tolyl group, a nitrophenyl group, a naphthyl group, a cyanophenyl group, a hydroxyphenyl group and a carboxyphenyl group), N,N-dialkylacrylamides (where the alkyl group has from 1 to 10 carbon atoms, such as methyl group, ethyl group, butyl group, isobutyl group, ethylhexyl group and cyclohexyl group), N,N-diarylacrylamides (examples of the aryl group include a phenyl group), N-methyl-N-phenylacrylamide, N-hydroxyethyl-N-methylacrylamide and N-2-acetamidoethyl-N-acetylacrylamide;

methacrylamides such as methacrylamide, N-alkylmethacrylamides (where the alkyl group has from 1 to 10 carbon atoms, such as methyl group, ethyl group, tert-butyl group, ethylhexyl group, hydroxyethyl group and cyclohexyl group), N-arylmethacrylamides (examples of the aryl group include a phenyl group), N,N-dialkylmethacrylamides (examples of the alkyl group include an ethyl group, a propyl group and a butyl group), N,N-diarylmethacrylamides (examples of the aryl group include a phenyl group), and N-hydroxyethyl-N-methylmethacrylamide, N-methyl-N-phenylmethacrylamide and N-ethyl-N-phenylmethacrylamide; allyl compounds such as allyl esters (e.g., allyl acetate, allyl caproate, allyl caprate, allyl laurate, allyl palmitate, allyl stearate, allyl benzoate, allyl acetoacetate, allyl lactate) and allyloxy ethanol;

vinyl ethers such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether), vinyl aryl ethers (e.g., vinyl phenyl ether, vinyl tolyl ether, vinyl chlorophenyl ether, vinyl-2,4-dichlorophenyl ether, vinyl naphthyl ether, vinyl anthranyl ether);

vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenyl acetate, vinyl acetoacetate, vinyl lactate, vinyl-β-phenyl butyrate, vinyl chlorohexylcarboxylate, vinyl benzoate, vinyl salicylate, vinyl chlorobenzoate, vinyl tetrachlorobenzoate and vinyl naphthoate;

styrenes such as styrene, alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene), alkoxystyrenes (e.g., methoxystyrene, 4-methoxy-3-methylstyrene, dimethoxystyrene), halogen styrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene), carboxystyrene and vinylnaphthalene;

crotonic acid esters such as alkyl crotonates (e.g., butyl crotonate, hexyl crotonate, glycerin monocrotonate); dialkyl itaconates (e.g., dimethyl itaconate, diethyl itaconate, dibutyl itaconate); and dialkyl esters of maleic acid or fumaric acid (e.g., dimethyl maleate, dibutyl fumarate), maleic acid anhydride, maleimide, acrylonitrile, methacrylonitrile, maleilonitrile. Other than these, addition polymerizable unsaturated compounds which can be copolymerized may be generally used.

The repeating structural units shown by these specific examples may be used individually or as a mixture of a plurality of units.

The above-described resins can be synthesized by a normal radical polymerization.

The molecular weight of the resin (A) having these repeating structural units of the present invention is preferably, in terms of the weight average, from 1,000 to 200,000, more preferably from 3,000 to 20,000. The molecular weight distribution is from 1 to 10, preferably from 1 o 3, more preferably from 1 to 2. As the molecular weigh distribution is smaller, the resolution, the resist form and the side wall of resist pattern are smoother and the roughness property is more excellent.

The resin (A) of the present invention is used in an amount of generally from 50 to 99.5 wt %, preferably from 80 to 99 wt %, more preferably from 90 to 98 wt %, based on the entire solid content of the composition.

[2] Components B1 and B2

The photosensitive resin composition of the present invention comprises:

(B1) a compound capable of generating an aliphatic or aromatic sulfonic acid substituted by at least one fluorine atom upon irradiation with actinic rays or radiation (component B1), and (B2) a compound capable of generating an aliphatic or aromatic sulfonic acid containing no fluorine atom or an aliphatic or aromatic carboxylic acid upon irradiation with actinic rays or radiation (component B2).

It is considered that upon irradiation of actinic rays or radiation, a plurality of acids different in the strength are generated, whereby the acid decomposable group corresponding to the edge portion of a line pattern is uniformly decomposed and the roughness is improved.

In the present invention, the components B1 and B2 can be generally selected from compounds used as a compound (photoacid generator) capable of decomposing upon irradiation of actinic rays or radiation to generate an acid.

More specifically, these components may be appropriately selected from photoinitiators for photocationic polymerization, photoinitiators for photoradical polymerization, photodecoloring agents for dyes, photo-discoloring agents, compounds capable of generating an acid upon irradiation with known light used for microresist and the like (for example, ultraviolet or far ultraviolet light of 200 to 400 nm, preferably g line, h line, i line and a KrF excimer laser ray) or with an ArF excimer laser ray, an $F_2$ excimer laser ray, an electron beam, an X ray, a molecular beam or an ion beam, and a mixture thereof.

Examples of this compound include onium salts such as diazonium salts described in S. I. Schlesinger, *Photogr. Sci. Eng.*, 18, 387 (1974), T. S. Bal et al., *Polymer*, 21, 423 (1980), etc., ammonium salts described in U.S. Pat. Nos. 4,069,055, 4,069,056 and Re27,992, JP-A-3-140140, etc., phosphonium salts described in D. C. Necker et al., *Macromolecules*, 17, 2468 (1984), C. S. Wen et al., *Teh, Proc. Conf. Rad. Curing ASIA*, p. 478, Tokyo, October (1988), U.S. Pat. Nos. 4,069,055 and 4,069,056, etc., iodonium salts described in J. V. Crivello et al., *Macromolecules*, 10 (6) 1307 (1977), *Chem. & Eng. News*, Nov. 28, p. 31 (1988), European Patents 104,143, 339,049 and 410,201, JP-A-2-150848, JP-A-2-296514, etc., sulfonium salts described in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci.*, Polymer Chem. Ed., 17, 2877 (1979), European Patents 370,693, 161,811, 410,201, 339,049, 233, 567, 297,443 and 297,442, U.S. Pat. Nos. 4,933,377, 3,902, 114, 4,760,013, 4,734,444 and 2,833,827, German Patents 2,904,626, 3,604,580 and 3,604,581, etc., selenonium salts described in J. V. Crivello et al., *Macromolecules*, 10 (6), 1307 (1977), J. V. Crivello et al., *J. Polymer Sci.*, Polymer Chem. Ed., 17, 1047 (1979), etc., and arsonium salts described in C. S. Wen et al., *Teh, Proc. Conf. Rad. Curing ASIA*, p. 478, Tokyo, October (1988), etc.; organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, etc.; organic metals/organic halides described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), JP-A-2-161445, etc.; photoacid generators having an o-nitrobenzyl type protective group described in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Commun.*, 532 (1972), S. Hayase et al., *Macromolecules*, 18, 1799 (1985), E. Reichmanis et al., *J. Electrochem. Soc., Solid State Sci. Technol.*, 130 (6), F. M. Houlihan et al., *Macromolecules*, 21, 2001 (1988), European Patents 0,290,750, 046,083, 156,535, 271,851, and 0,388,343, U.S. Pat. Nos. 3,901,710 and 4,181,531, JP-A-60-198538, JP-A-53-133022, etc.; compounds which are photochemically decomposed to generate sulfonic acid, represented by iminosulfonate, described in M. TUNOOKA et al., *Polymer Preprints Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints, Japan*, 37 (3), European Patents 0,199,672, 84,515, 044,115, 618,564 and 0,101,122, U.S. Pat. Nos. 4,371,605 and 4,431,774, JP-A-64-18143, JP-A-2-245756, JP-A-3-140109, etc.; and disulfone compounds described in JP-A-61-166544, etc.

The components B1 and B2 of the present invention are described in detail below.

(1) [a] A compound capable of generating an aliphatic or aromatic sulfonic acid substituted by at least one fluorine atom upon irradiation with actinic rays or radiation (component B1):

The component B1 is a compound capable of generating a fluorine-containing sulfonic acid upon irradiation with actinic rays or radiation (and an ionic compound having a fluorine-containing sulfonic acid as the anion) (component (B1)) and examples thereof include an iodonium salt represented by the following formula (PAG3) and a sulfonium salt represented by formula (PAG4):

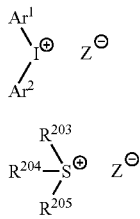

wherein $Ar^1$ and $Ar^2$ each independently represents a substituted or unsubstituted aryl group, $R^{203}$, $R^{204}$ and $R^{205}$ each independently represents a substituted or unsubstituted alkyl group or a substituted or unsubstituted aryl group, $Z^-$ represents a sulfonate anion having at least one fluorine atom, and two of $R^{203}$, $R^{204}$ and $R^{205}$, or $Ar^1$ and $Ar^2$ may be bonded through a single bond or a substituent.

The aryl group of $Ar^1$, $Ar^2$, $R^{203}$, $R^{204}$ and $R^{205}$ is preferably an aryl group having from 6 to 14 carbon atoms and the an alkyl group is preferably an alkyl group having from 1 to 8 carbon atoms.

Preferred examples of the substituent for the aryl group include an alkoxy group having from 1 to 8 carbon atoms, an alkyl group having from 1 to 8 carbon atoms, an alkoxycarbonyl group having from 2 to 9 carbon atoms, an alkylcarbonylamino group having from 2 to 9 carbon atoms, a nitro group, a carboxyl group, a hydroxy group, a halogen atom and a phenyl thio group, and preferred examples of the substituent for the alkyl group include an alkoxy group having from 1 to 8 carbon atoms, an aryl group having from 5 to 14 carbon atoms, an arylcarbonyl group having from 6 to 15 carbon atoms, a carboxyl group and a halogen atom.

Preferred examples of the sulfonate anion of $Z^-$ include an aliphatic hydrocarbon having at least one fluorine atom and having from 1 to 20 carbon atoms and an aromatic hydrocarbon having from 5 to 20 carbon atoms. These hydrocarbons each may have a substituent and examples of the substituent include an alkoxy group having from 1 to 10 carbon atoms, which may be substituted by fluorine, an alkoxycarbonyl group having from 2 to 11 carbon atoms, which may be substituted by fluorine, a phenylamino group, a phenylcarbonyl group, a halogen atom and a hydroxyl group. The substituent of the aromatic hydrocarbon further includes an alkyl group having from 1 to 15 carbon atoms.

Specific examples are set forth below, however, the present invention is not limited thereto.

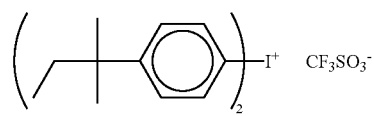

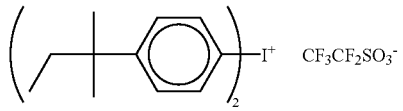

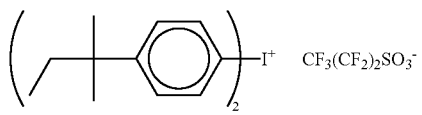

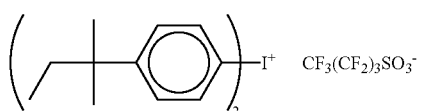

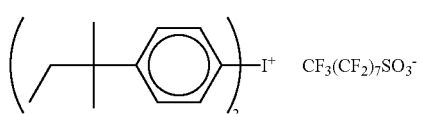

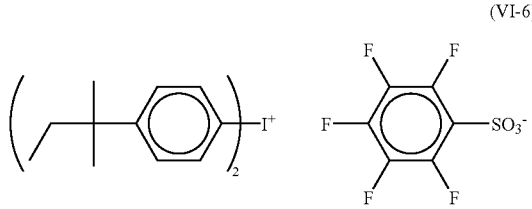

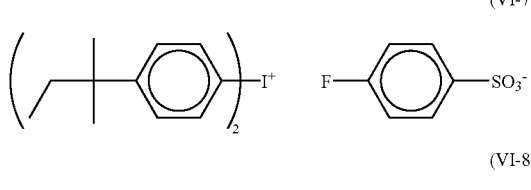

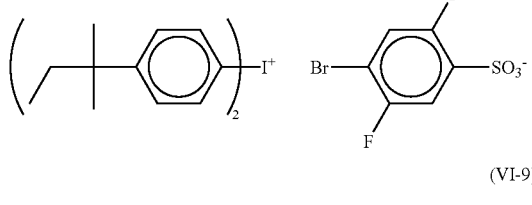

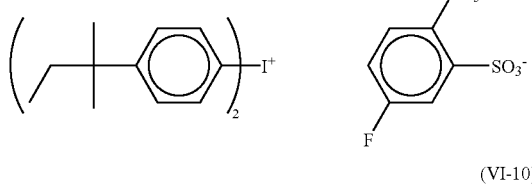

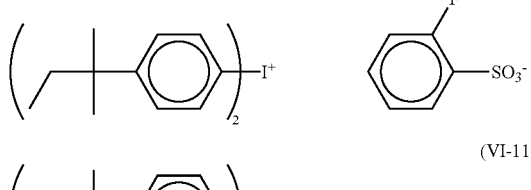

-continued
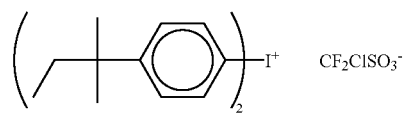 (VI-12)
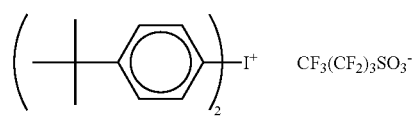 (VI-13)
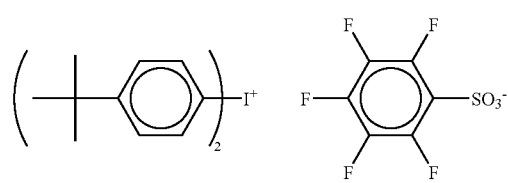 (VI-14)
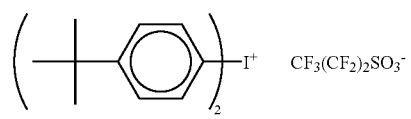 (VI-15)
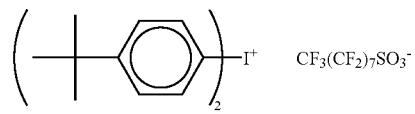 (VI-16)
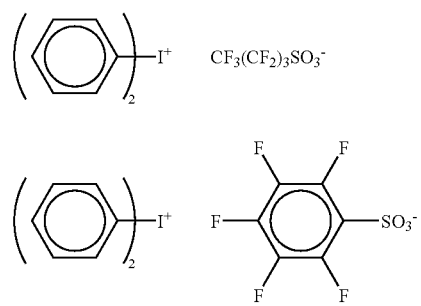 (VI-17) (VI-18)
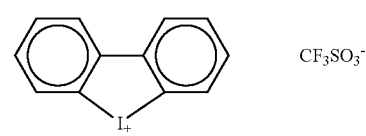 (VI-19)
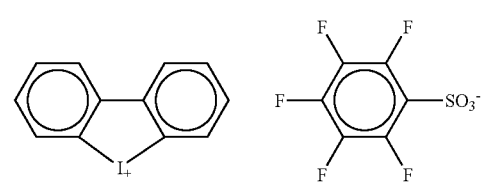 (VI-20)
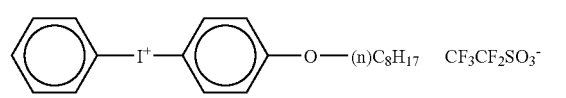 (VI-21)
-continued
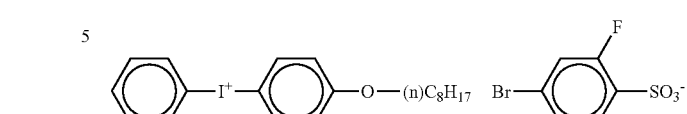 (VI-22)
 (VI-23)
 (VI-24)
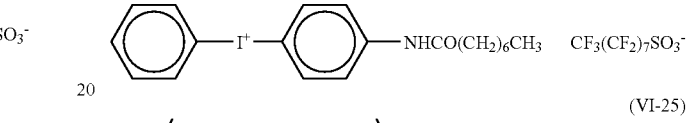 (VI-25)
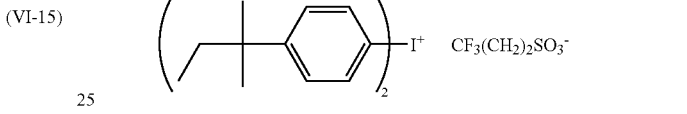 (VI-26)
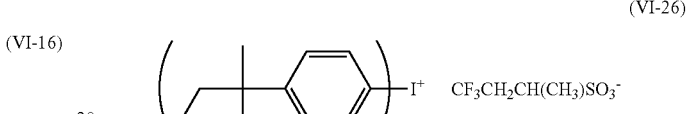 (VI-27)
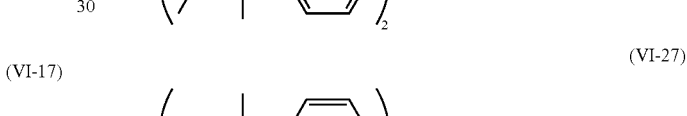 (VI-28)
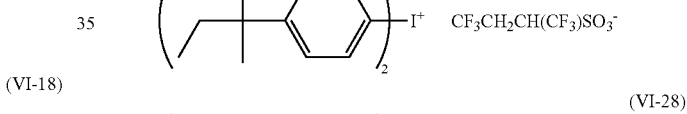 (VI-29)
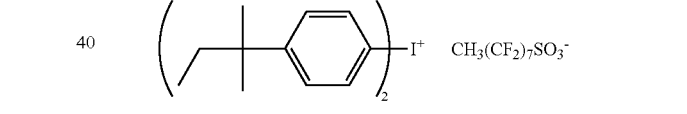 (VI-30)
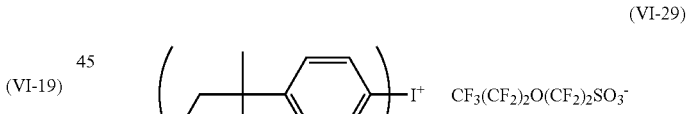 (VI-31)
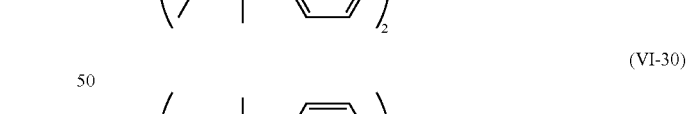 (VI-32)

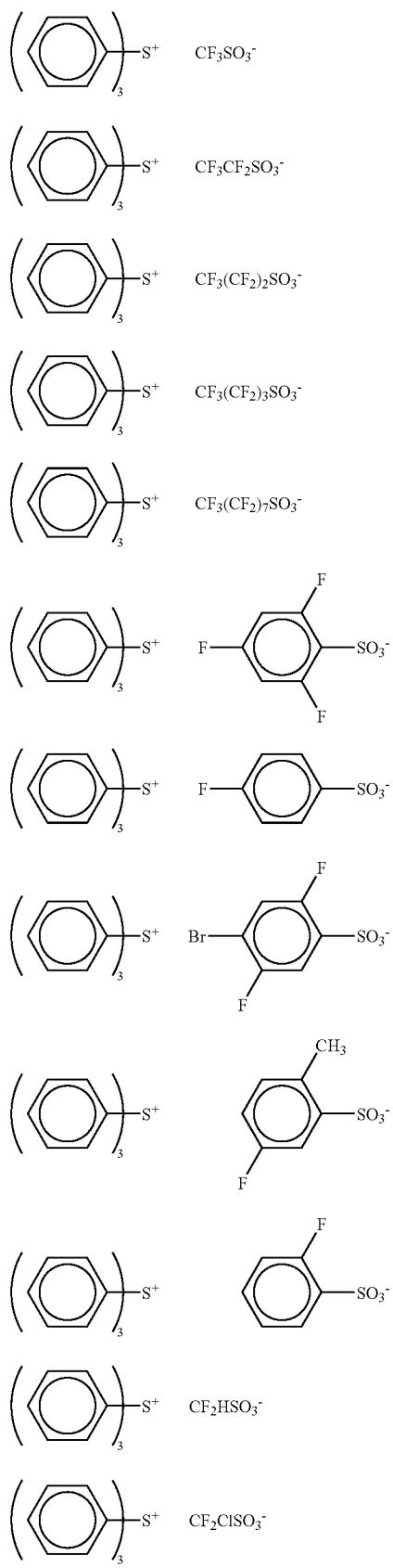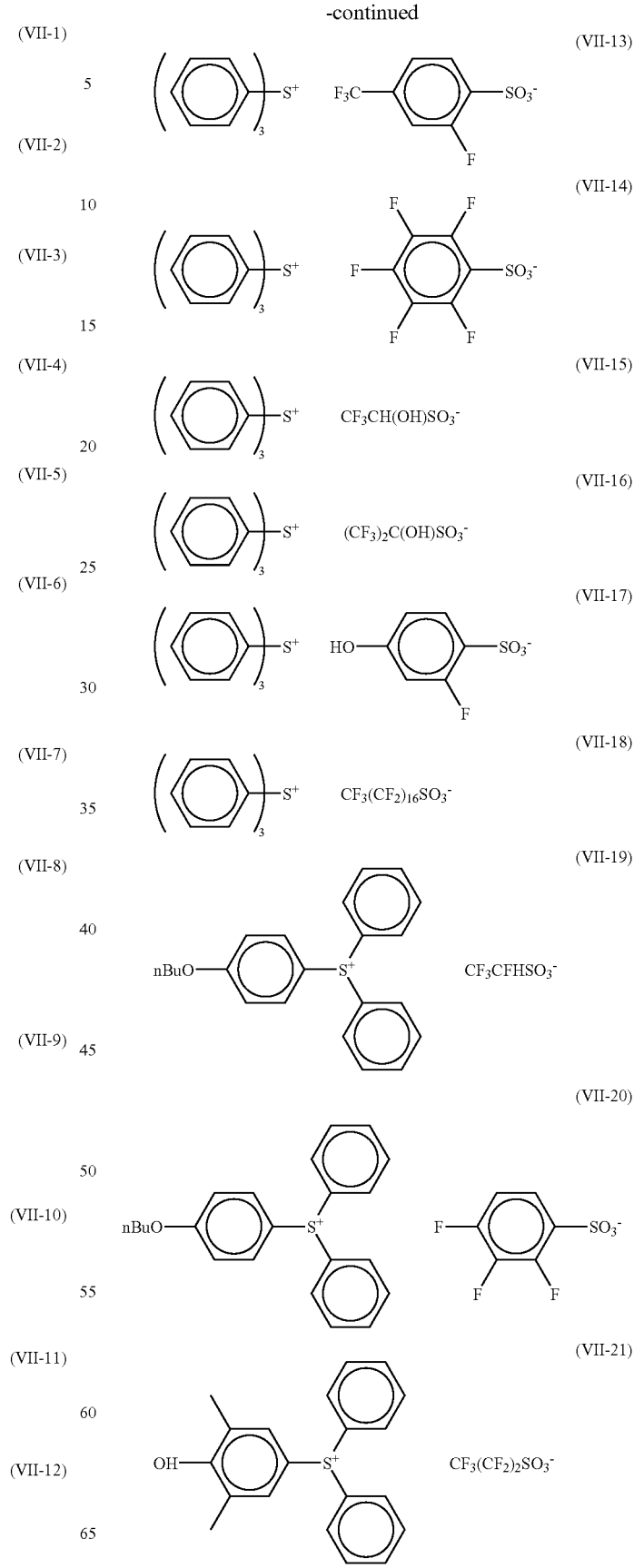

-continued
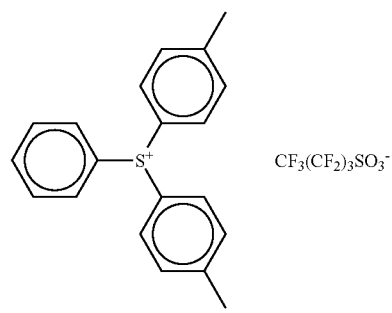 (VII-22) CF$_3$(CF$_2$)$_3$SO$_3^-$
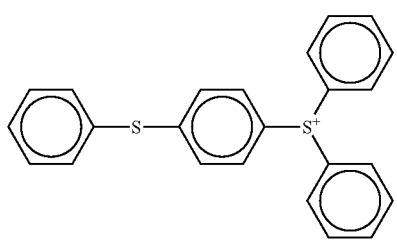 (VII-23) CF$_3$SO$_3^-$
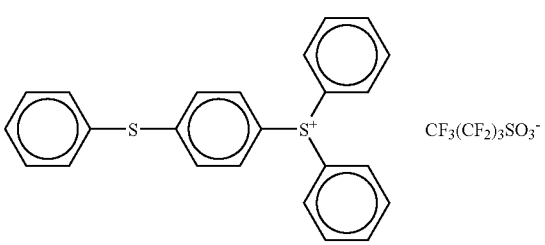 (VII-24) CF$_3$(CF$_2$)$_3$SO$_3^-$
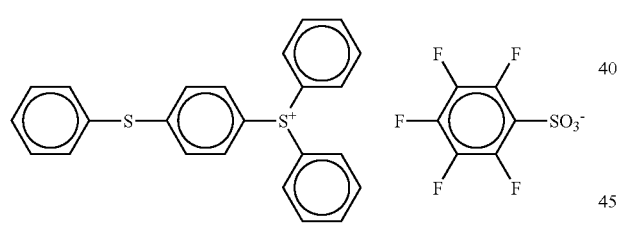 (VII-25)
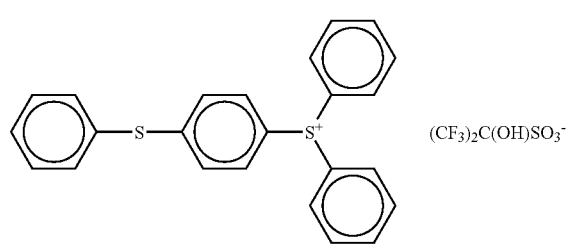 (VII-26) (CF$_3$)$_2$C(OH)SO$_3^-$
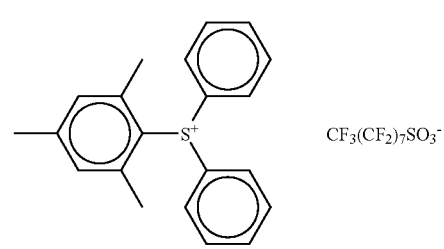 (VII-27) CF$_3$(CF$_2$)$_7$SO$_3^-$
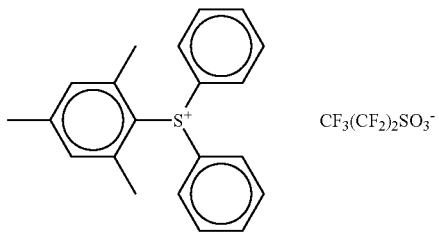 (VII-28) CF$_3$(CF$_2$)$_2$SO$_3^-$
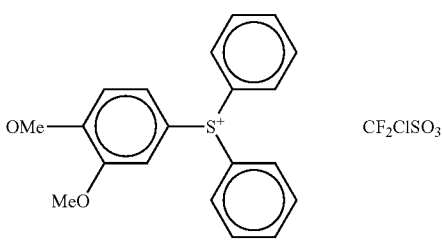 (VII-29) CF$_2$ClSO$_3^-$
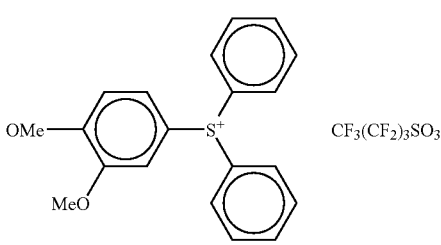 (VII-30) CF$_3$(CF$_2$)$_3$SO$_3^-$
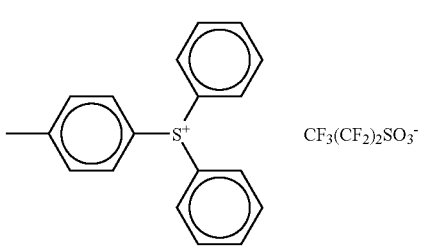 (VII-31) CF$_3$(CF$_2$)$_2$SO$_3^-$
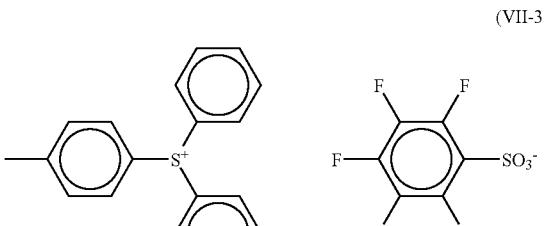 (VII-32)
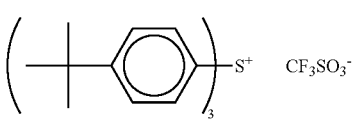 (VII-33) CF$_3$SO$_3^-$
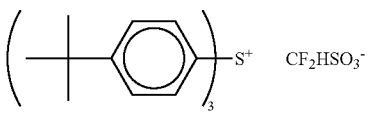 (VII-34) CF$_2$HSO$_3^-$
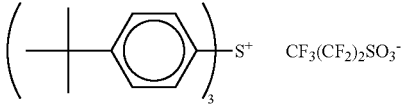 (VII-35) CF$_3$(CF$_2$)$_2$SO$_3^-$ -continued (VII-36)

(VII-37)

(VII-38)

(VII-39)

(VII-40)

(VII-41)

(VII-42)

(VII-43)

-continued (VII-44)

(VII-45)

(VII-46)

(VII-47)

(VII-48)

(VII-49)

-continued

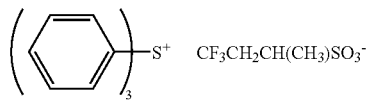 (VII-50)

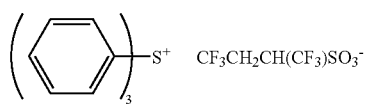 (VII-51)

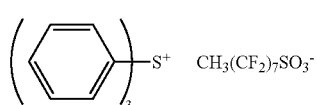 (VII-52)

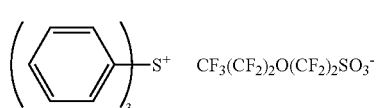 (VII-53)

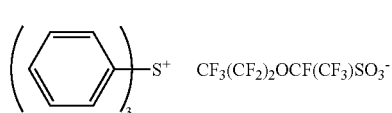 (VII-54)

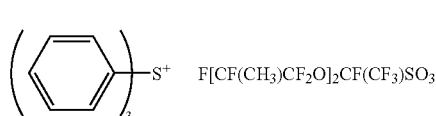 (VII-55)

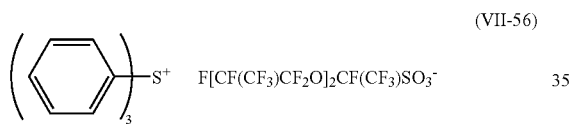 (VII-56)

(2) (B2) A compound capable of generating an aliphatic or aromatic sulfonic acid containing no fluorine atom or an aliphatic or aromatic carboxylic acid upon irradiation with actinic rays or radiation:

[b] Examples of the compound capable of generating a fluorine-free sulfonic acid upon irradiation of actinic rays or radiation (and an ionic compound having a fluorine-free sulfonic acid as the anion) include an iodonium salt and a sulfonium salt represented by formulae (PAG3) and (PAG4) where $Z^-$ is a sulfonate anion containing no fluorine atom.

Specific examples thereof include the following compounds, however, the present invention is not limited thereto.

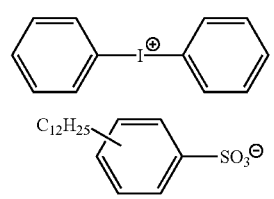 (PAG3-1)

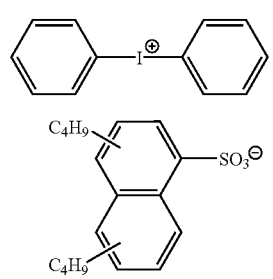 (PAG3-2)

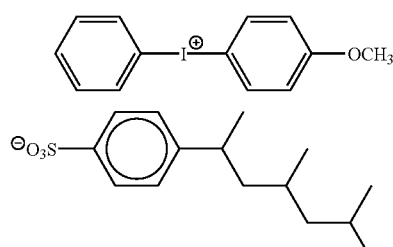 (PAG3-5)

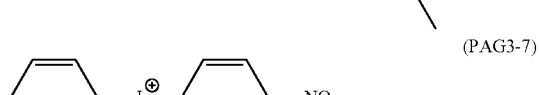

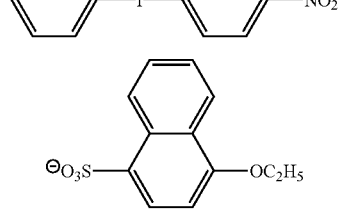 (PAG3-7)

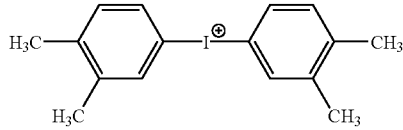

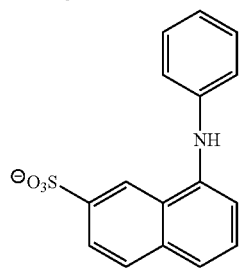 (PAG3-9)

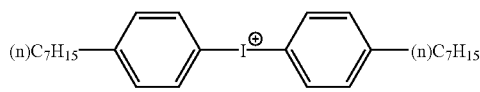 (PAG3-10)

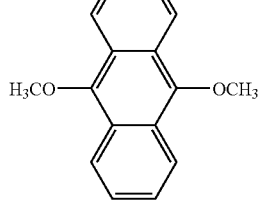

-continued
(PAG3-11)
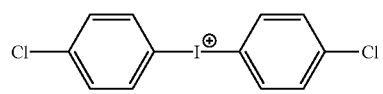
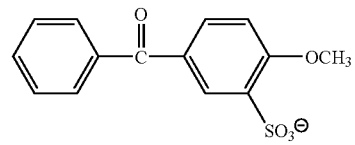
(PAG3-13)
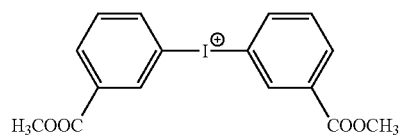
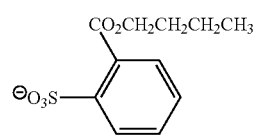
(PAG3-14)
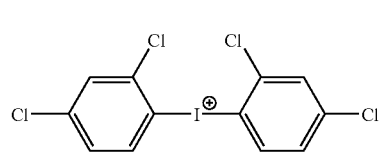
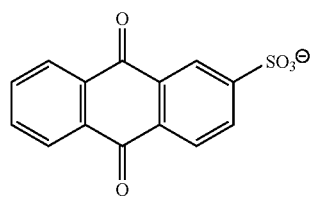
(PAG3-15)
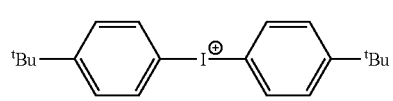
(PAG3-16)
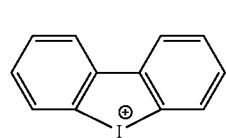 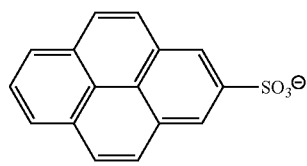
(PAG3-18)
(PAG3-19)
-continued
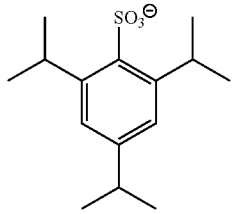
(PAG3-24)
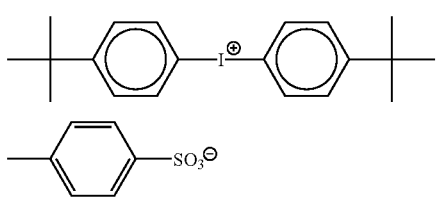
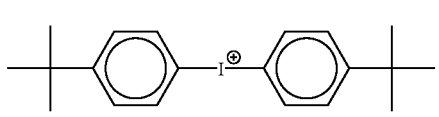
(PAG3-25)
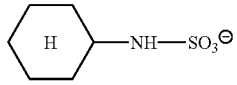
(PAG3-26)
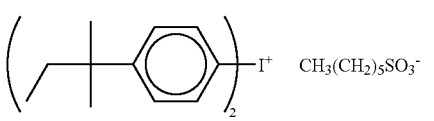
(PAG3-27)
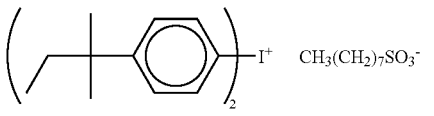
(PAG3-28)
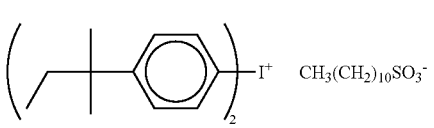
(PAG3-29)
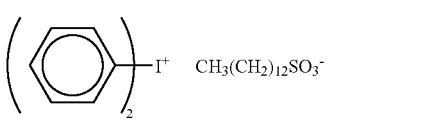
(PAG3-30)
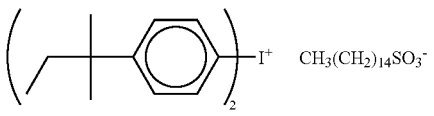
(PAG3-31)
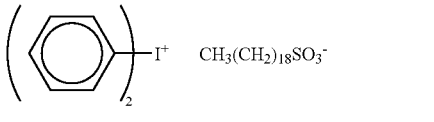
(PAG4-1)
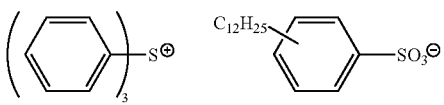

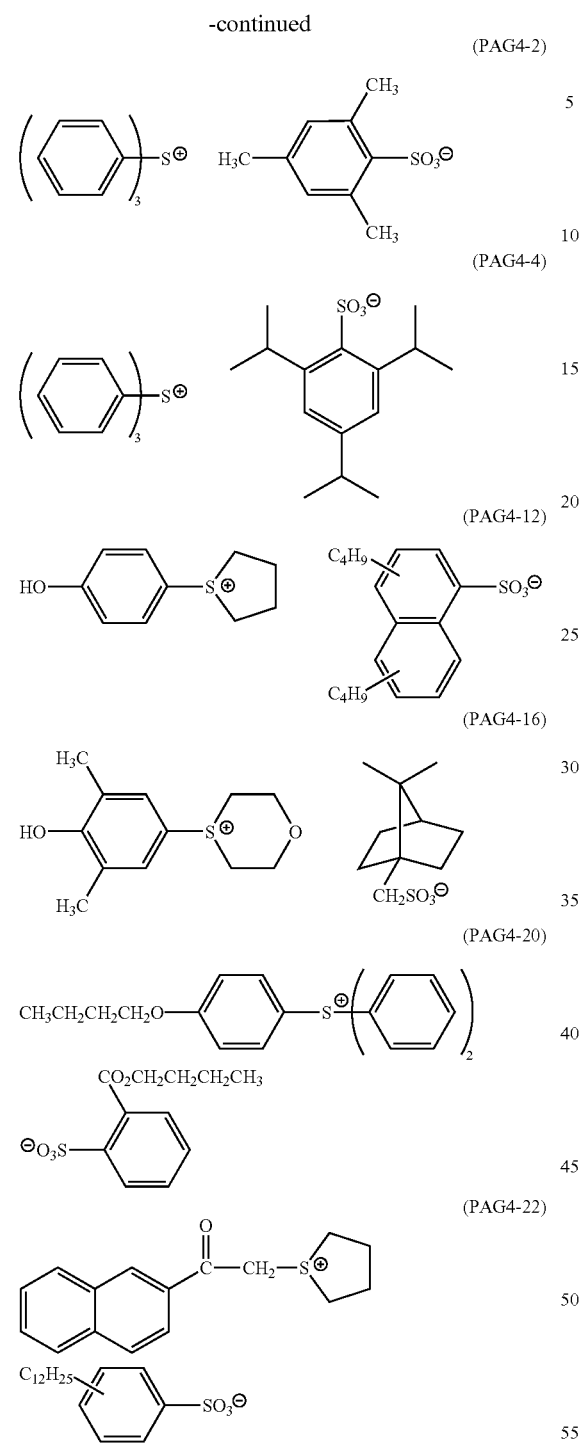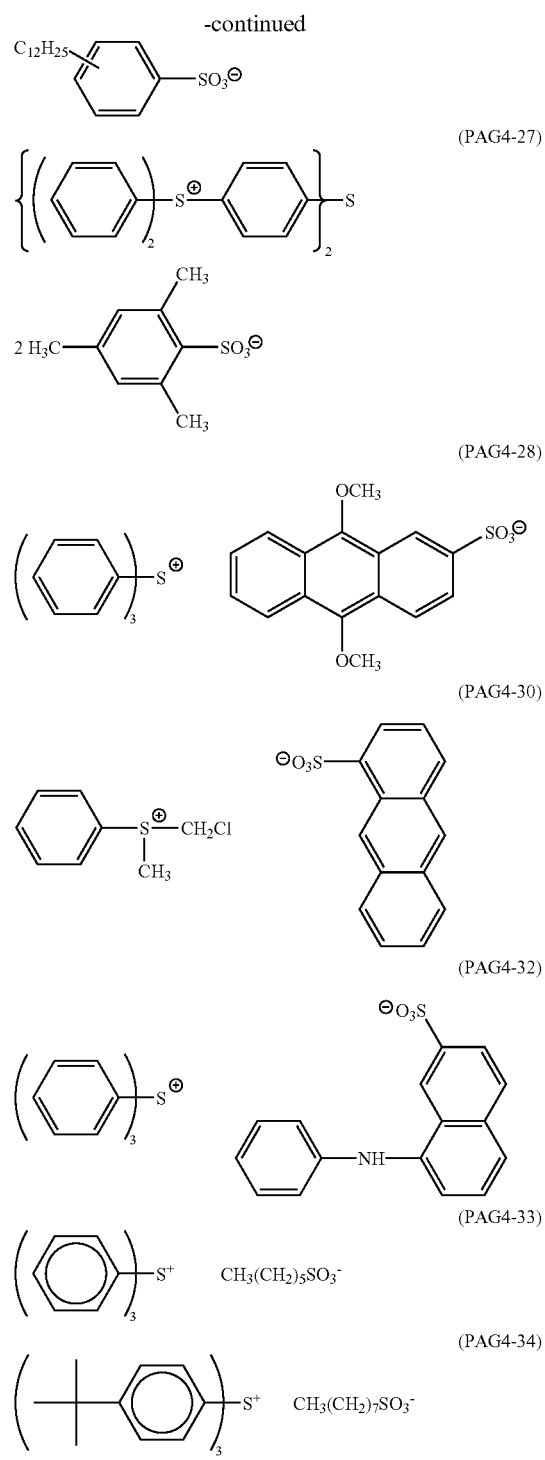

-continued (PAG4-36)

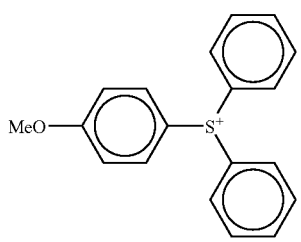

(PAG4-37)

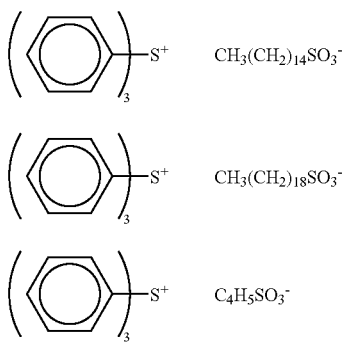

(PAG4-38)

(PAG4-39)

Other examples include a disulfonic acid derivative represented by the following formula (PAG5) and an iminosulfonate derivative represented by formula (PAG6):

$$Ar^3—SO_2—SO_2—Ar^4 \quad (PAG5)$$

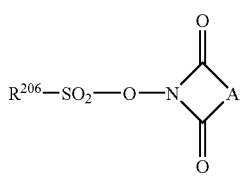
(PAG6)

wherein $Ar^3$ and $Ar^4$ each independently represents a substituted or unsubstituted aryl group, $R^{206}$ represents a substituted or unsubstituted alkyl group or a substituted or unsubstituted aryl group, and A represents a substituted or unsubstituted alkylene group, a substituted or unsubstituted alkenylene group or a substituted or unsubstituted arylene group.

Specific examples thereof include the following compounds, however, the present invention is by no means limited thereto.

(PAG5-1)

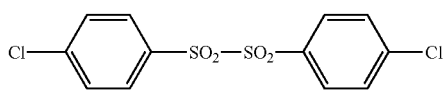

(PAG5-2)

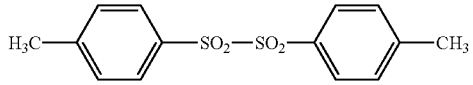

(PAG5-3)

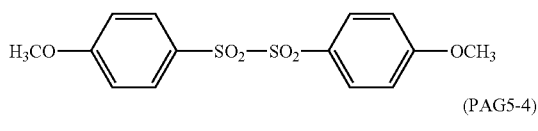

(PAG5-4)

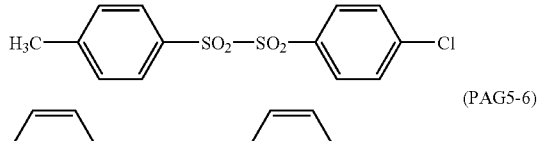

(PAG5-6)

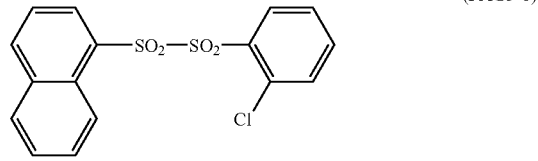

(PAG5-7)

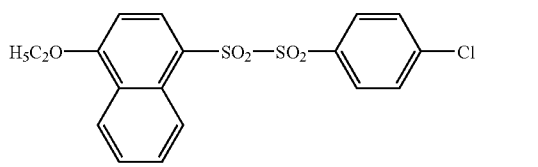

(PAG5-8)

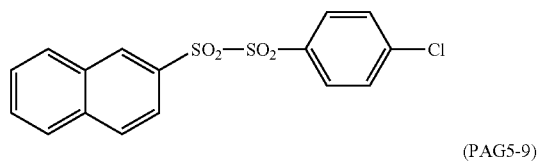

(PAG5-9)

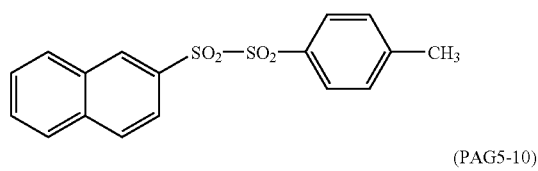

(PAG5-10)

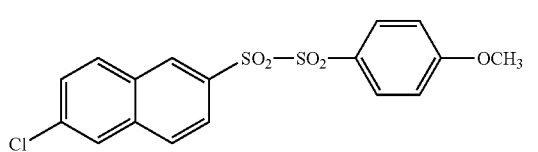

(PAG5-11)

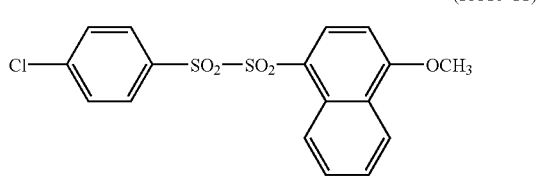

(PAG5-12)

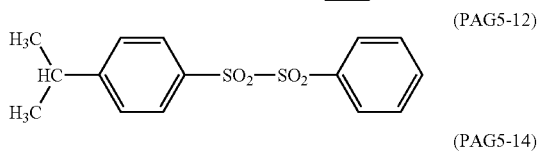

(PAG5-14)

(PAG5-15)

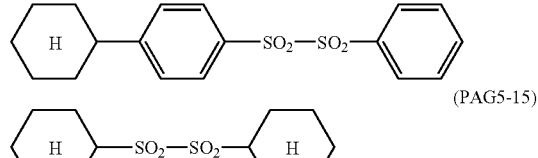

-continued (PAG6-1), (PAG6-2), (PAG6-3), (PAG6-5), (PAG6-6), (PAG6-7), (PAG6-8), (PAG6-9), (PAG6-10), (PAG6-11), (PAG6-12), (PAG6-17), (PAG6-20), (PAG6-22)

Still other examples include a diazodisulfone derivative represented by the following formula (PAG7):

(PAG7)

wherein R represents a linear, branched or cyclic alkyl group or an aryl group which may be substituted.

Specific examples thereof include the following compounds, however, the present invention is not limited thereto.

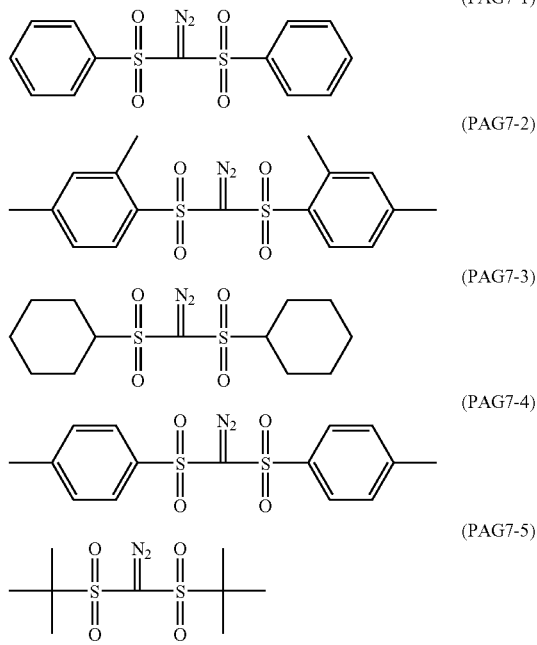

(PAG7-1)
(PAG7-2)
(PAG7-3)
(PAG7-4)
(PAG7-5)

The compounds described above in [a] and [b] can be synthesized by reacting an aromatic compound using a periodate and salt-exchanging the obtained iodonium salt with a corresponding sulfonic acid.

Also, the compounds can be synthesized by reacting an aryl Grignard's reagent such as aryl magnesium bromide with a substituted or unsubstituted phenylsulfoxide and salt-exchanging the obtained triarylsulfonium halide with a corresponding sulfonic acid. Furthermore, the compounds can be synthesized by a method of condensing and salt-exchanging a substituted or unsubstituted phenylsulfoxide and a corresponding aromatic compound using an acid catalyst such as methanesulfonic acid/diphosphorus pentoxide or aluminum chloride, or a method of condensing and salt-exchanging a diaryl iodonium salt and diaryl sulfide using a catalyst such as copper acetate.

The salt-exchanging can be performed by once synthesizing a halide salt and exchanging it into a sulfonate using a silver reagent such as silver oxide or by using an ion exchange resin. The sulfonic acid or sulfonate for use in the salt-exchanging may be a commercially available product or may be obtained by hydrolysis of a commercially available sulfonic acid halide.

[c] A compound capable of generating a fluorine-containing carboxylic acid upon irradiation with actinic rays or radiation (and an ionic compound having a fluorine-containing carboxylic acid as the anion): the compound (B2) is described.

Examples of the aliphatic carboxylic acid substituted by fluorine include fluorine-substituted products of an aliphatic carboxylic acid such as acetic acid, propionic acid, n-butyric acid, isobutyric acid, valerianic acid, trimethylacetic acid, caproic acid, heptanoic acid, caprylic acid, pelargonic acid, capric acid, lauric acid, myristic acid, palmitic acid, stearic acid, undecanoic acid, dodecanoic acid and tridecanoic acid. These each may have a hydroxyl group, an aloxy group or a halogen atom as the substituent. In particular, those containing a linking group such as oxygen atom, sulfur atom, carbonyl group, carboxyl group and sulfonyl group in the aliphatic chain are preferred.

Preferred examples of the aliphatic carboxylic acid substituted by fluorine include an aliphatic carboxylic acid represented by the following formula:

$$L-(CH_2)_p(CF_2)_q(CH_2)_r-COOH$$

wherein L represents a hydrogen atom or a fluorine atom, p and r each independently represents an integer of 0 to 15 and q represents an integer of 1 to 15. The hydrogen atom or fluorine atom of the alkyl chain in this formula may be substituted by an alkyl group (preferably having from 1 to 5 carbon atoms) which may be substituted by a fluorine atom, an alkoxy group (preferably having from 1 to 5 carbon atoms) which may be substituted by a fluorine atom, or a hydroxyl group.

The aliphatic carboxylic acid substituted by fluorine is preferably a fluorine substituted product of a saturated aliphatic carboxylic acid having from 2 to 20 carbon atoms, more preferably from 4 to 20 carbon atoms. By having 4 or more carbon atoms, diffusibility in the decomposing property of carboxylic acid generated decreases and the change in line width due to aging after exposure to heating can be more suppressed. In particular, a fluorine-substituted product of a linear or branched saturated aliphatic carboxylic acid having from 4 to 18 carbon atoms is more preferred.

The aromatic carboxylic acid substituted by fluorine is preferably a fluorine-substituted product of an aromatic carboxylic acid having from 7 to 20 carbon atoms, more preferably from 7 to 15 carbon atoms, still more preferably from 7 to 11 carbon atoms. Specific examples thereof include a fluorine-substituted product of an aromatic carboxylic acid such as benzoic acid, substituted benzoic acid, naphthoic acid, substituted naphthoic acid, anthracenecarboxylic acid and substituted anthracenecarboxylic acid (examples of the substituent include an alkyl group, an alkoxy group, a hydroxyl group, a halogen atom, an aryl group, an acyl group, an acyloxy group, a nitro group, an alkylthio group and an arylthio group). Among these, a fluorine-substituted product of benzoic acid or substituted benzoic acid is preferred.

In the aliphatic or aromatic carboxylic acid substituted by fluorine, one or more hydrogen atom present in the skeleton except for the carboxyl group is substituted by a fluorine atom. In particular, an aliphatic or aromatic carboxylic acid where all hydrogen atoms present in the skeleton except for the carboxyl group are substituted by a fluorine atom (that is, a perfluoro saturated aliphatic carboxylic acid or a perfluoro aromatic carboxylic acid) is preferred. By this, more excellent sensitivity is attained.

The compound is preferably an onium salt compound (e.g., sulfonium salt, iodonium salt) having, as the counter anion, the anion of the aliphatic or aromatic carboxylic acid substituted by a fluorine atom, or an imidocarboxylate or nitrobenzyl ester compound having a carboxylic acid ester group.

The compound is more preferably a compound represented by the following formula (I), (II) or (III).

By using these compounds, more excellent effect is attained in the sensitivity, resolution and exposure margin. This compound functions as a photoacid generator which generates a saturated aliphatic or aromatic carboxylic acid substituted by at least one fluorine atom, corresponding to $X^-$ of formulae (I) to (III), when irradiated with actinic rays or radiation.

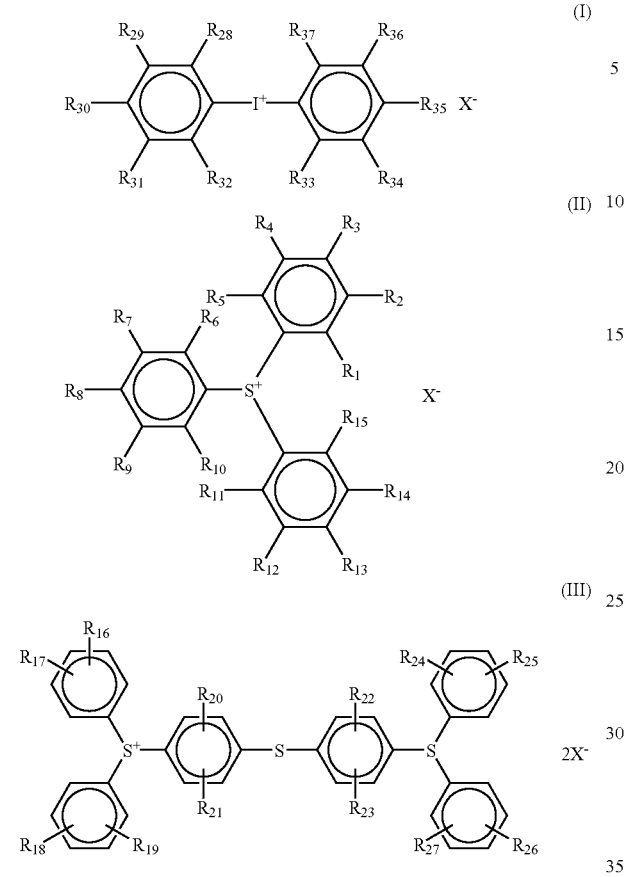

(wherein $R_1$ to $R_{37}$ each independently represents a hydrogen atom, a linear, branched or cyclic alkyl group, a linear, branched or cyclic alkoxy group, a hydroxy group, a halogen atom or a —S—$R_{38}$ group, $R_{38}$ represents a linear branched cyclic alkyl group or an aryl group, and $X^-$ represents an anion of an aliphatic or aromatic carboxylic acid substituted by at least one fluorine atom).

$X^-$ is preferably an anion of a perfluoro aliphatic carboxylic acid or a perfluoro aromatic carboxylic acid, more preferably an anion of a fluorine-substituted alkylcarboxylic acid having 4 or more carbon atoms.

In formulae (I) to (III), the linear or branched alkyl group of $R_1$ to $R_{38}$ includes a linear or branched alkyl group having from 1 to 4 carbon atoms, which may have a substituent, such as methyl group, ethyl group, propyl group, n-butyl group, sec-butyl group and tert-butyl group. The cyclic alkyl group includes a cyclic alkyl group having from 3 to 8 carbon atoms, which may have a substituent, such as cyclopropyl group, cyclopentyl group and cyclohexyl group.

The alkoxy group of $R_1$ to $R_{37}$ includes an alkoxy group having from 1 to 4 carbon atoms, such as methoxy group, ethoxy group, hydroxyethoxy group, propoxy group, n-butoxy group, isobutoxy group, sec-butoxy group and tert-butoxy group.

The halogen atom of $R_1$ to $R_{37}$ includes a fluorine atom, a chlorine atom, a bromine atom and an iodine atom.

The aryl group of $R_{38}$ includes an aryl group having from 6 to 14 carbon atoms, such as phenyl group, tolyl group, methoxyphenyl group and naphthyl group. The aryl group may have a substituent.

Preferred examples of the substituent include an alkoxy group having from 1 to 4 carbon atoms, a halogen atom (e.g., fluorine, chlorine, iodine), an aryl group having from 6 to 10 carbon atoms, an alkenyl group having from 2 to 6 carbon atoms, a cyano group, a hydroxy group, a carboxy group, an alkoxycarbonyl group and a nitro group.

The iodonium or sulfonium compound represented by formulae (I) to (III) for use in the present invention has, as the counter anion $X^-$, an anion of a saturated aliphatic or aromatic carboxylic acid substituted by at least one fluorine atom. This anion is an anion (—COO$^-$) after a hydrogen atom of the carboxylic acid (—COOH) is desorbed.

Specific examples are set forth below, however, the present invention is not limited thereto. Specific Examples (I-1f) to (I-36f) of Photoacid Generator Represented by Formula (I):

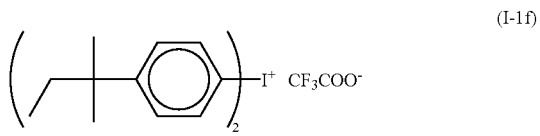

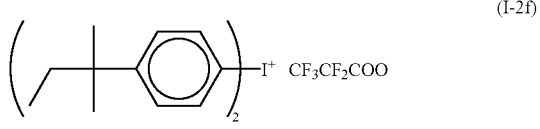

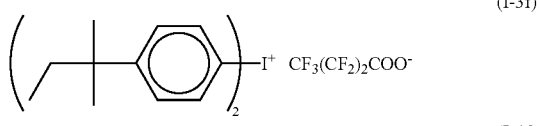

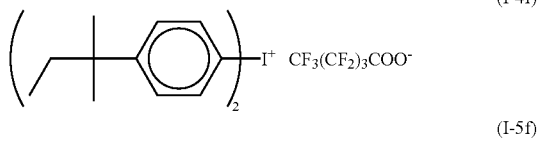

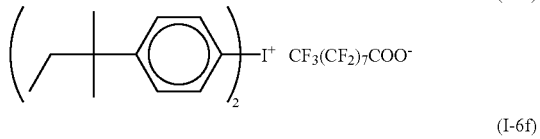

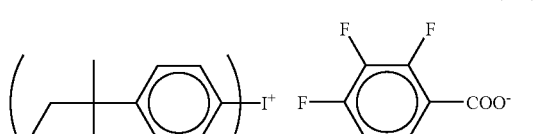

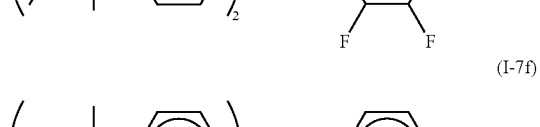

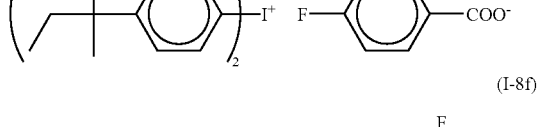

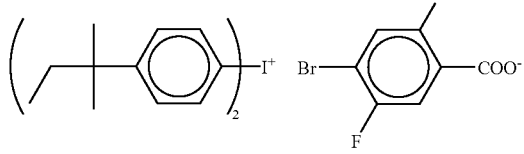

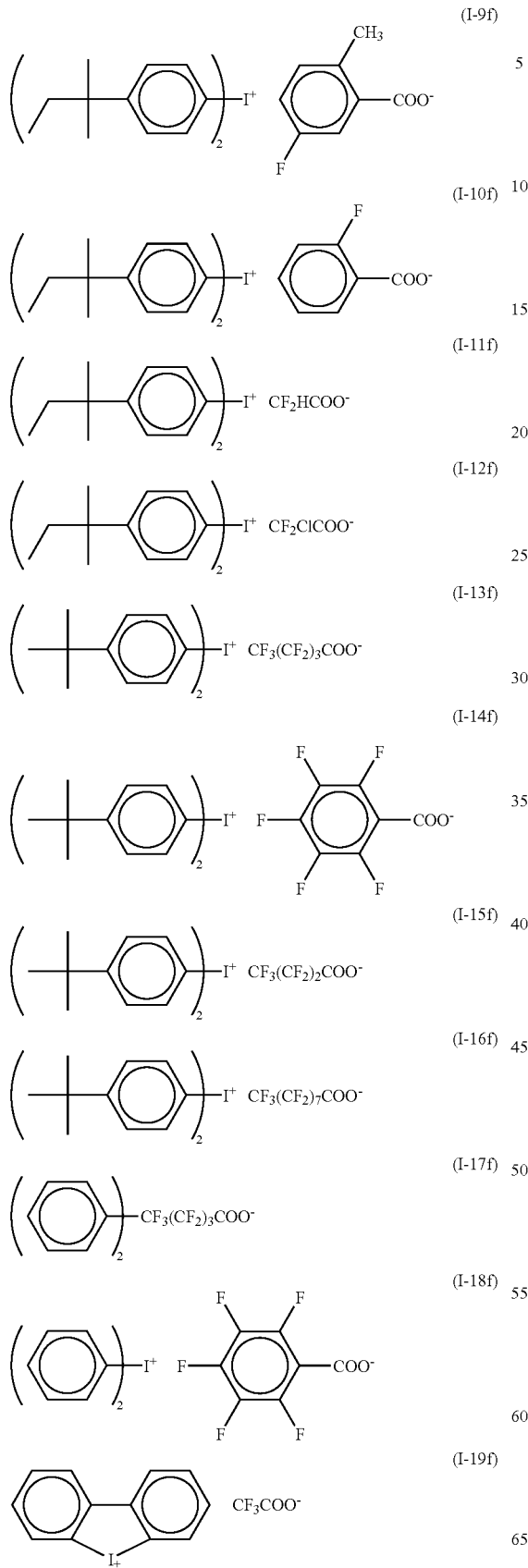
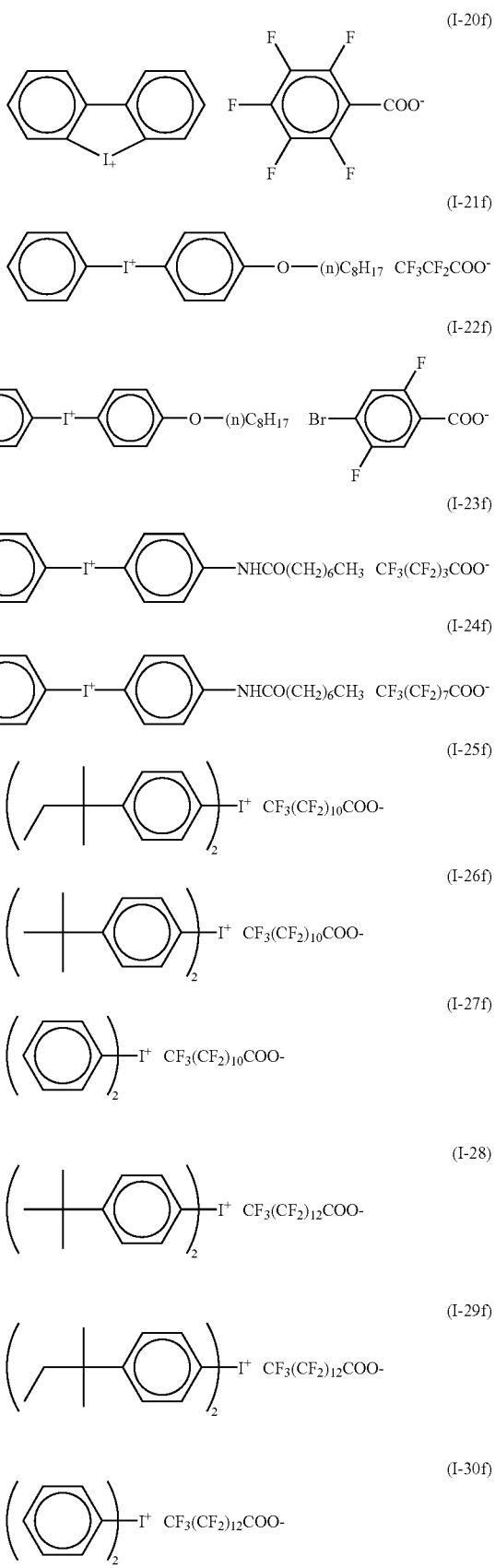

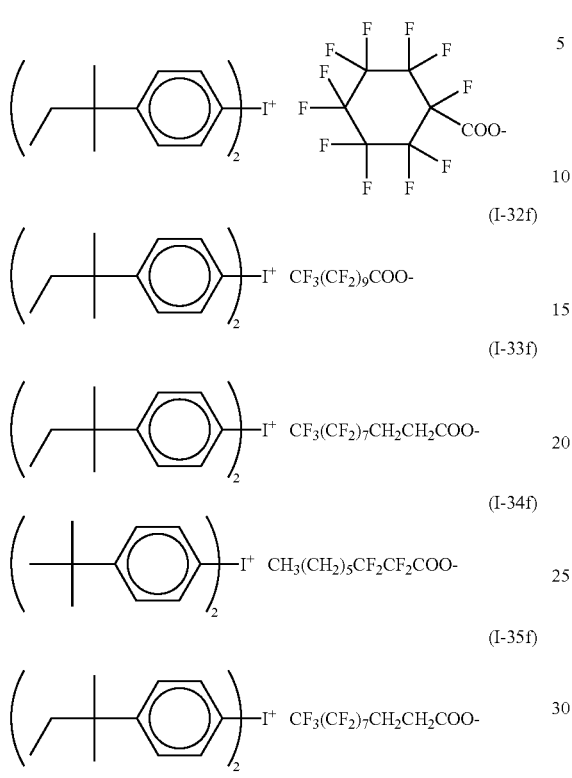
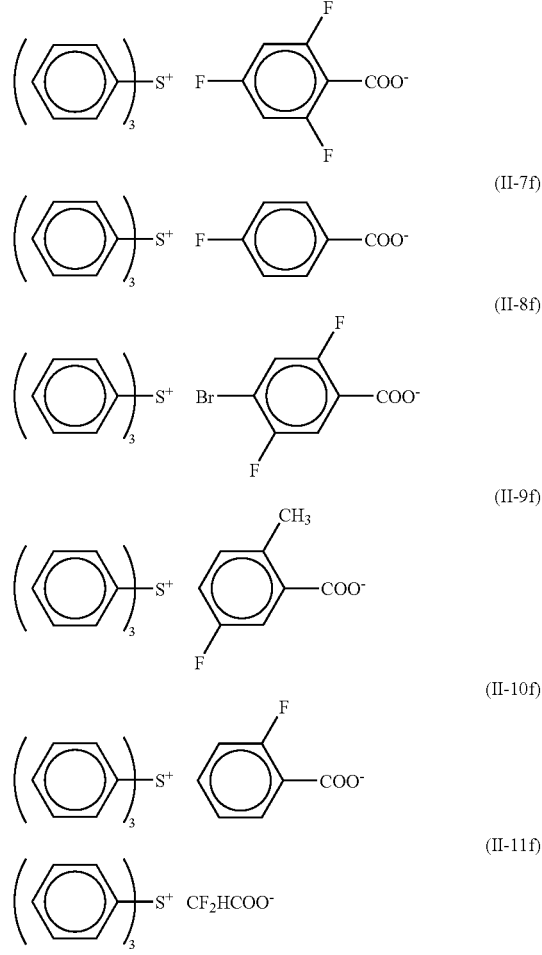
Specific Examples (II-1f) to (II-67f) of Photoacid Generator Represented by Formula (II):
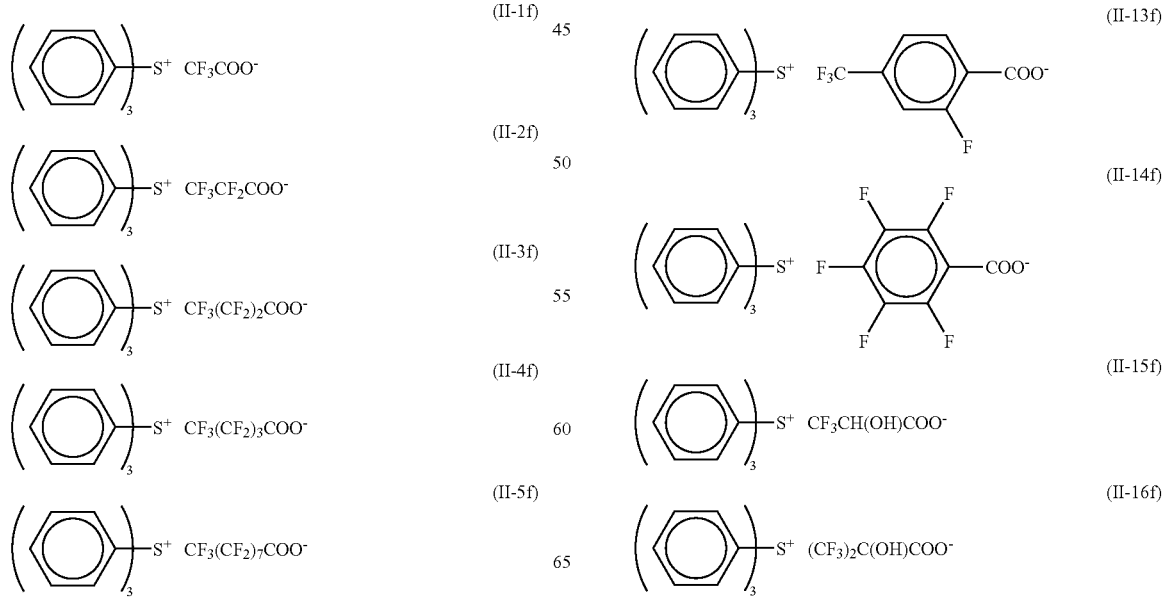

(II-17f)
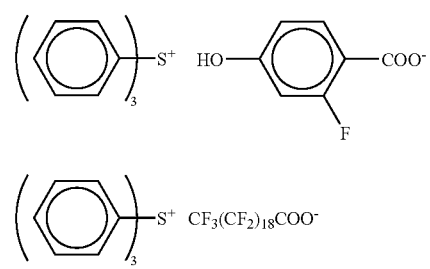
(II-18f)
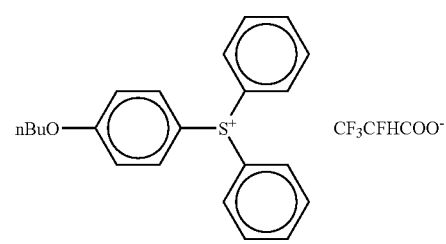
(II-19f)
(II-20f)
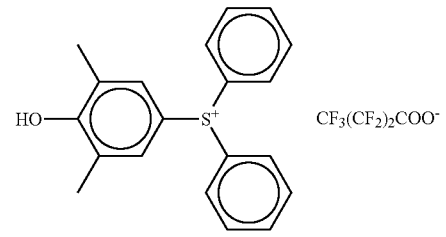
(II-21f)
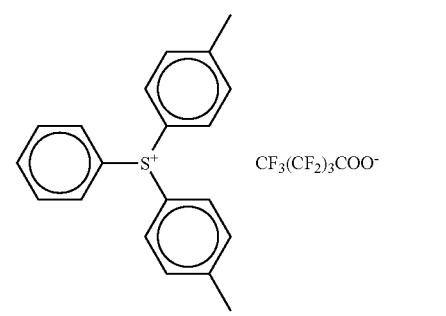
(II-22f)
(II-23f)
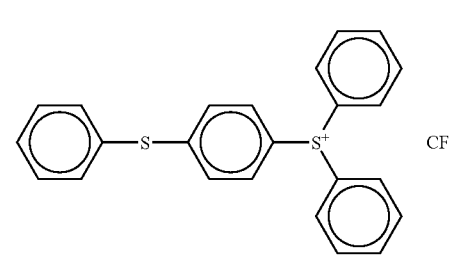
(II-24f)
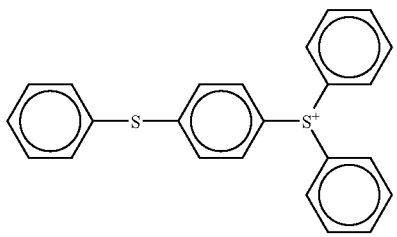
(II-25f)
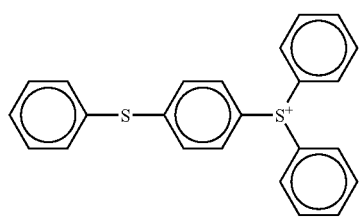
(II-26f)
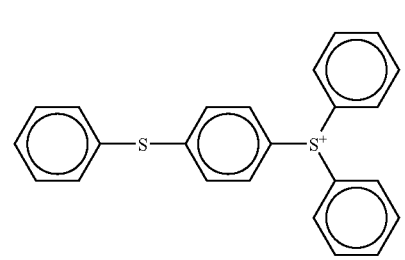
(II-27f)
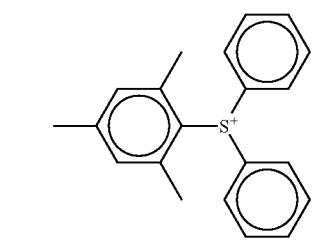
(II-28f)
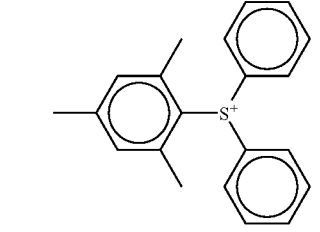
(II-29f)
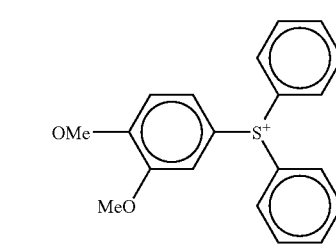
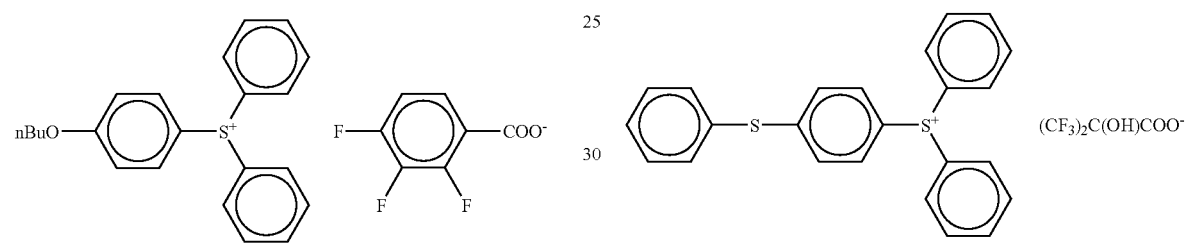
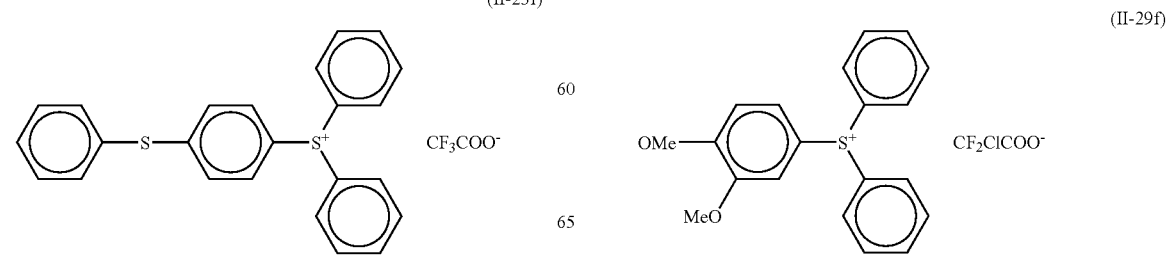

-continued
(II-30f)
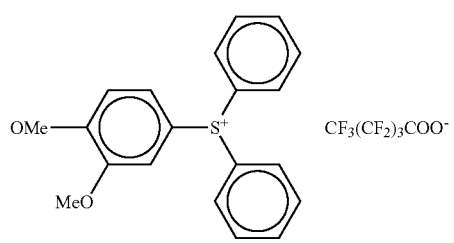
(II-31f)
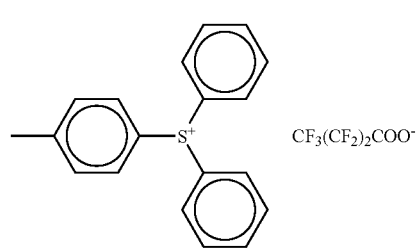
(II-32f)
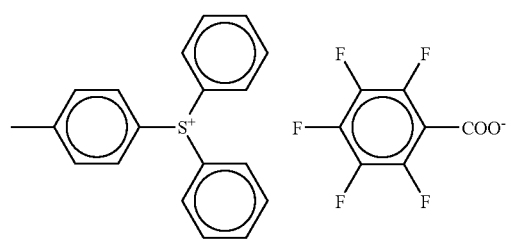
(II-33f)
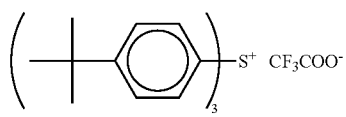
(II-34f)
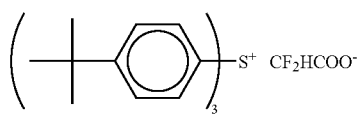
(II-35f)
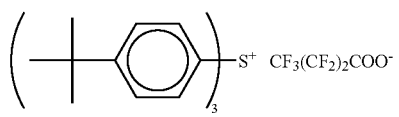
(II-36f)
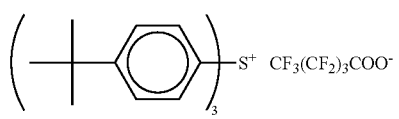
(II-37f)
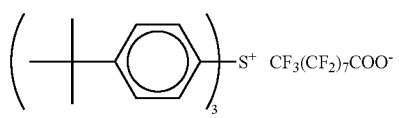
(II-38f)
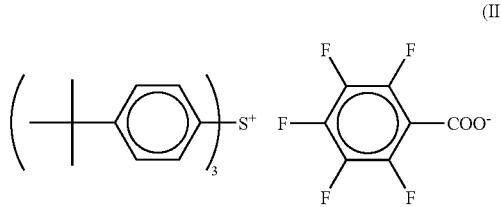
-continued
(II-39f)
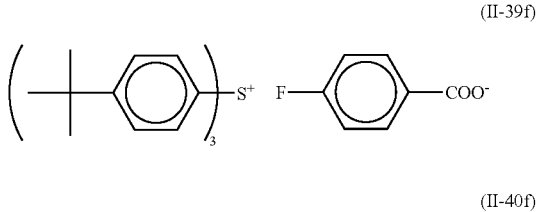
(II-40f)
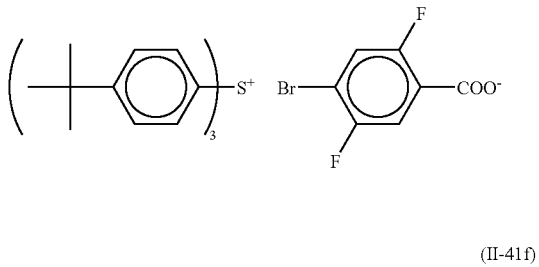
(II-41f)
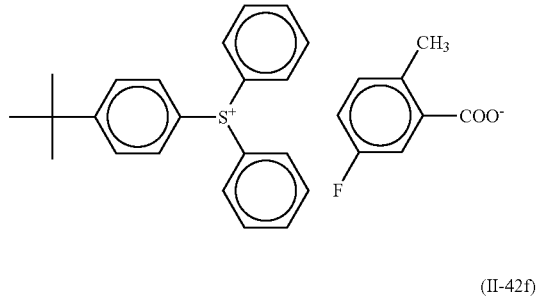
(II-42f)
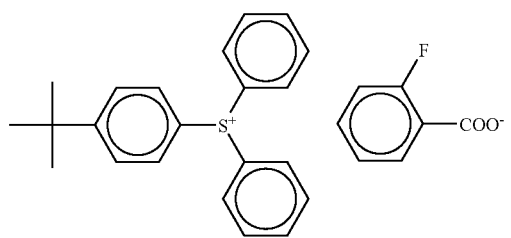
(II-43f)
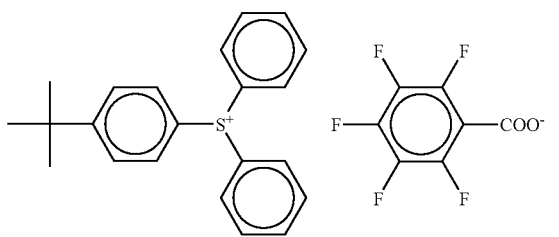
(II-44f)
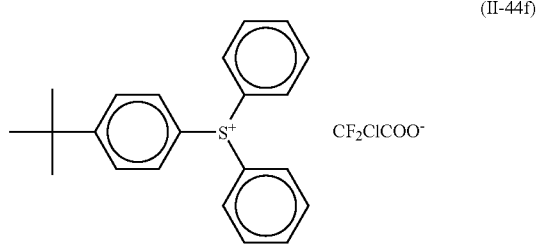

-continued
(II-45f)
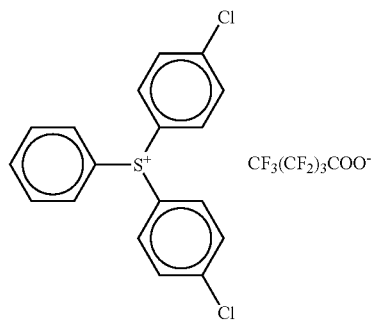
(II-46f)
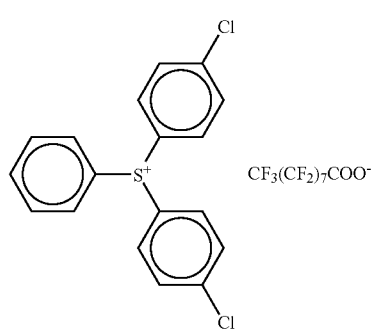
(II-47f)
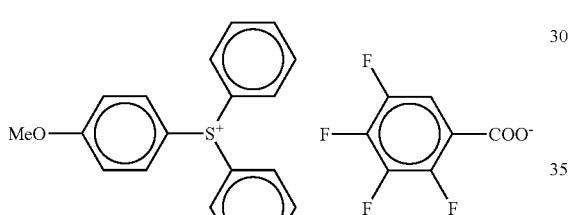
(II-48f)
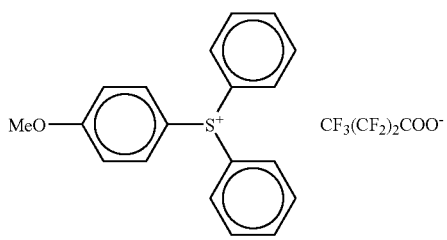
(II-49f)
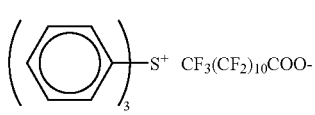
(II-50f)
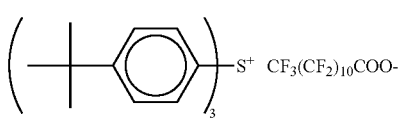
(II-51f)
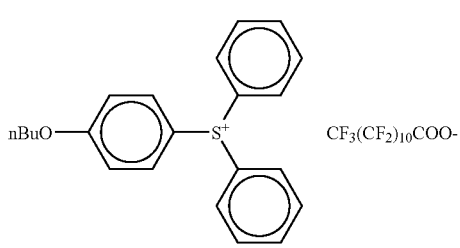
-continued
(II-52f)
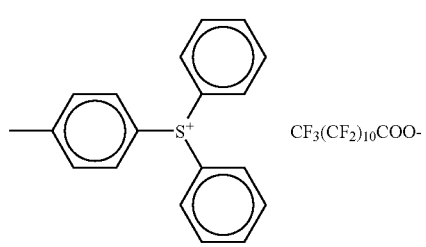
(II-53f)
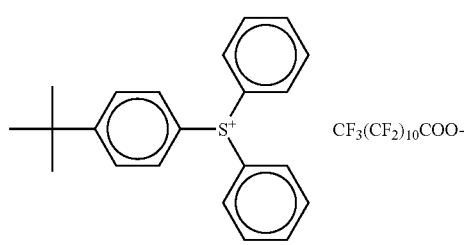
(II-54f)
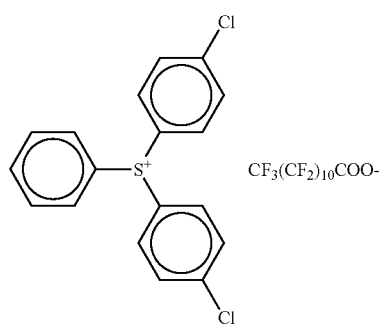
(II-55f)
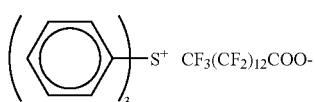
(II-56f)
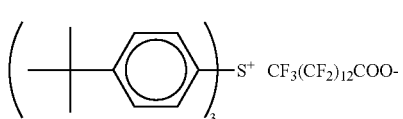
(II-57f)
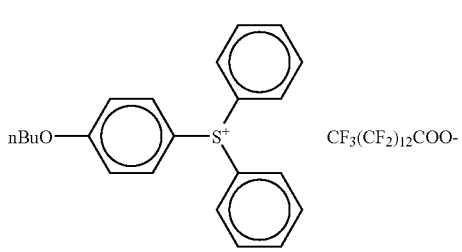
(II-58f)
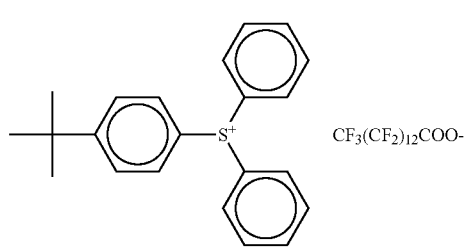

-continued
(II-59f)
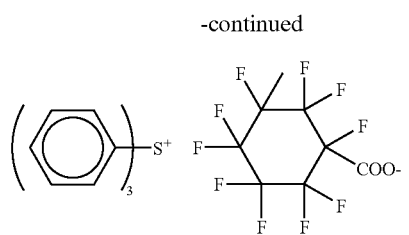
(II-60f)
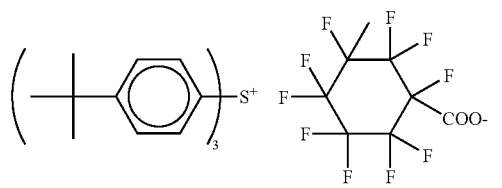
(II-61f)
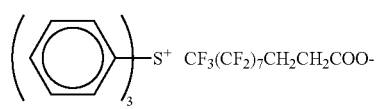
(II-62f)
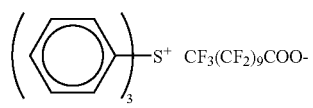
(II-63f)
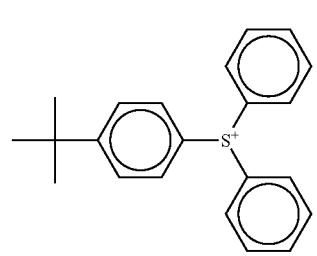
(II-64f)
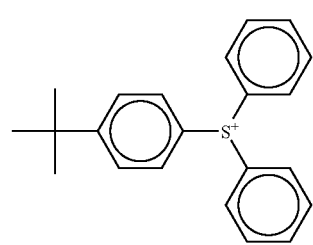
(II-65f)
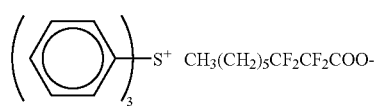
(II-66f)
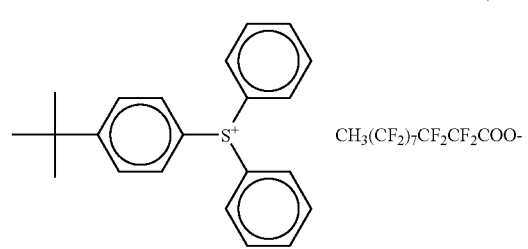
-continued
(II-67f)
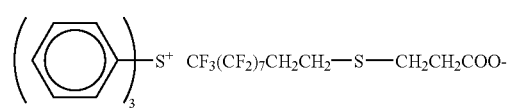
Specific Examples (III-1f) to (III-4f) of Photoacid Generator Represented by Formula (III):
(III-1f)
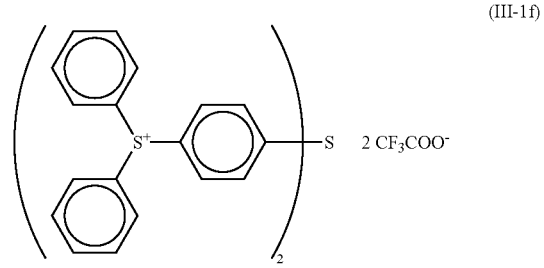
(III-2f)
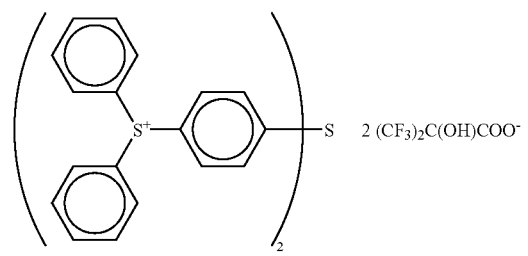
(III-3f)
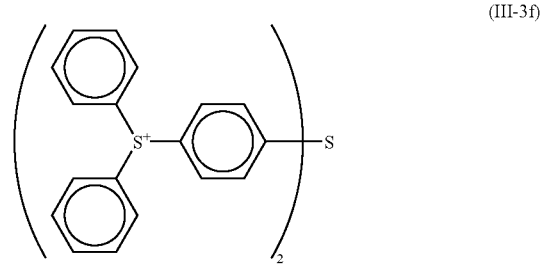
(III-4f)
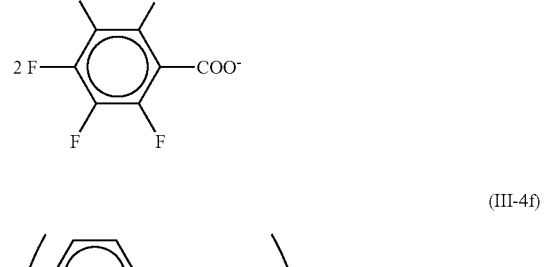

Specific Examples (IV-1f) to (V-4f) of Other Photoacid Generators:

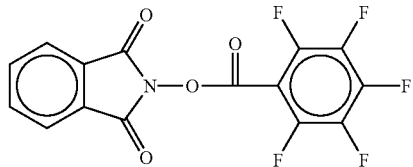
(IV-1f)

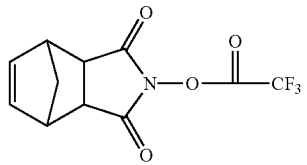
(IV-2f)

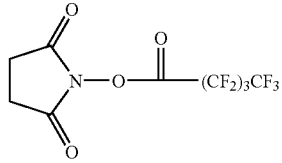
(IV-3f)

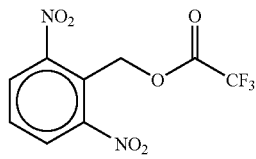
(V-1f)

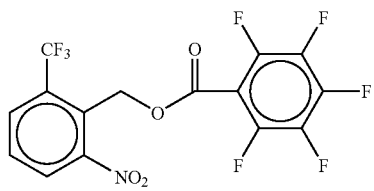
(V-2f)

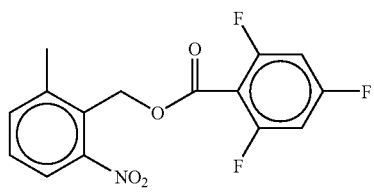
(V-3f)

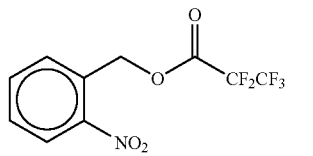
(V-4f)

The compound represented by formula (I) can be synthesized by reacting an aromatic compound using a periodate and salt-exchanging the obtained iodonium salt with a corresponding carboxylic acid.

The compounds represented by formulae (II) and (III) can be synthesized by reacting an aryl Grignard's reagent such as aryl magnesium bromide with a substituted or unsubstituted phenylsulfoxide and salt-exchanging the obtained triarylsulfonium halide with a corresponding carboxylic acid. These compounds can also be synthesized by a method of condensing and salt-exchanging a substituted or unsubstituted phenylsulfoxide and a corresponding aromatic compound using an acid catalyst such as methanesulfonic acid/diphosphorus pentoxide or aluminum chloride, or a method of condensing and salt-exchanging a diaryl iodonium salt and diaryl sulfide using a catalyst such as copper acetate.

The salt-exchanging can be performed by once synthesizing a halide salt and exchanging it into a carboxylate using a silver reagent such as silver oxide or by using an ion exchange resin. The carboxylic acid or carboxylate for use in the salt-exchanging may be a commercially available product or may be obtained by hydrolysis of a commercially available carboxylic acid halide.

For the fluorine-substituted carboxylic acid as the anion moiety, a carboxylic acid derived from a fluoro aliphatic compound produced by telomerization method (also called a telomer method) or an oligomerization (also called an oligomer method) is also preferably used. The production process of this fluoro aliphatic compound is described, for example, in Nobuo Ishikawa (supervisor), *Fusso Kagobutsu no Gosei to Kino* (*Synthesis and Function of Fluorine Compounds*), CMC, pp. 117–118 (1987), and Milos Hudlicky and Attila E. Pavlath, *Chemistry of Organic Fluorine Compounds II*, Monograph 187, pp. 747–752, American Chemical Society (1995). The telomerization is a method of radical polymerizing a fluorine-containing vinyl compound such as tetrafluoroethylene using an alkyl halide having a large chain transfer constant, such as iodide, as the telogen to synthesize a telomer (an example is shown in Scheme-1). In the synthesis by the telomer method, a mixture containing a plurality of compounds different in the carbon chain length is obtained. This mixture may be used as it is or may be purified before use.

[d] Specific examples of the compound capable of generating a fluorine-free carboxylic acid upon irradiation with actinic rays or radiation and the ionic compound having a fluorine-free carboxylic acid as the anion: the compound (B2) are described below, however, the present invention is not limited thereto.

Examples include the compounds represented by the following formulae (AI) to (AV):

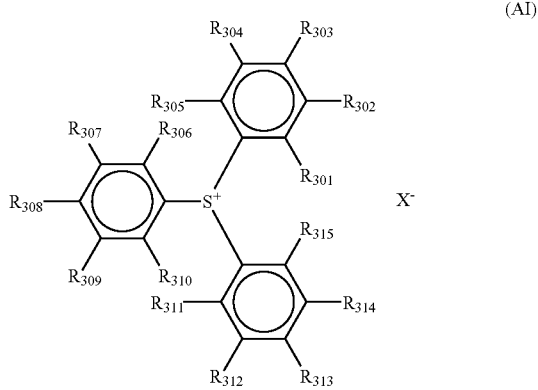
(AI)

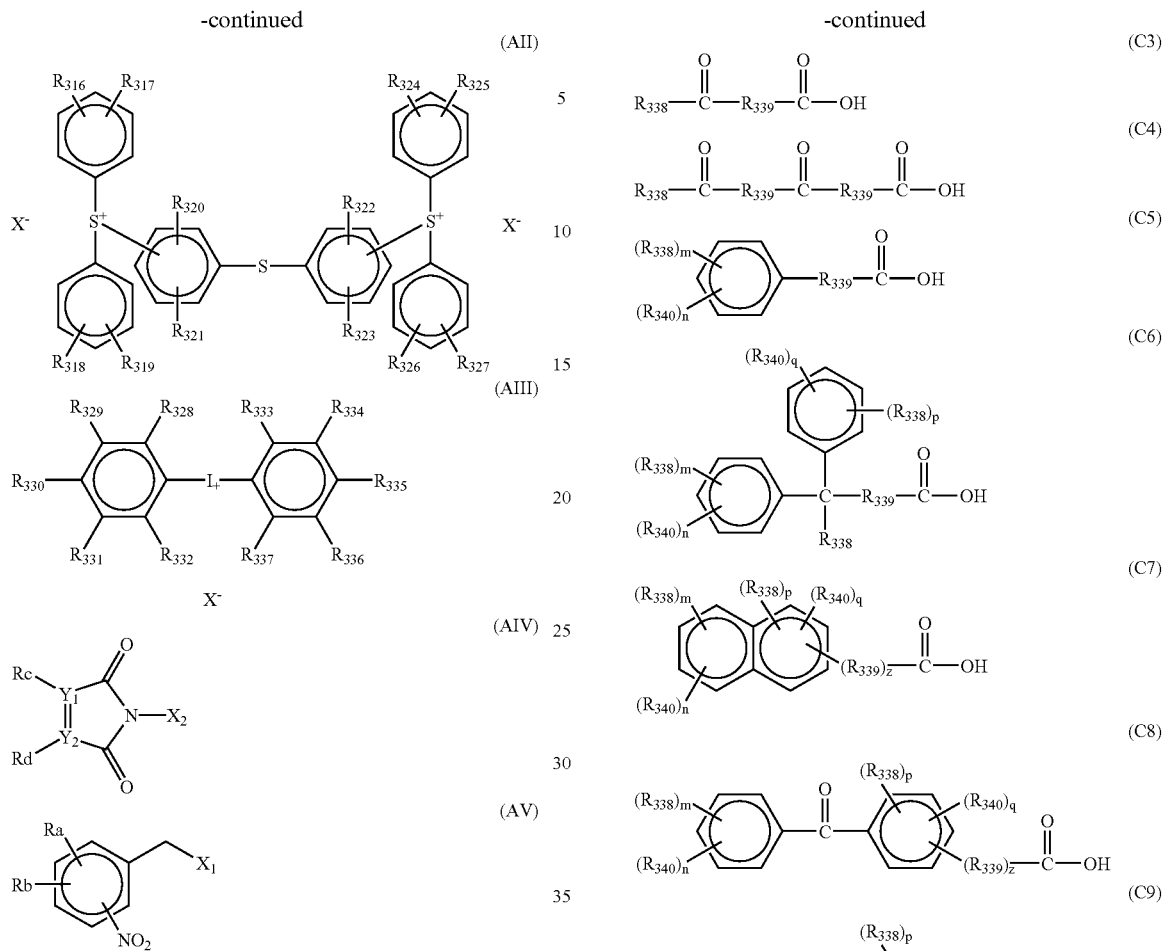

wherein $R_{301}$ to $R_{337}$ each independently represents a hydrogen atom, a linear, branched or cyclic alkyl group, a linear, branched or cyclic alkoxy group, a hydroxy group, a halogen atom or —S—$R_0$ group, $R_0$ represents a linear, branched or cyclic alkyl group or an aryl group, Ra and Rb each independently represents a hydrogen atom, a nitro group, a halogen atom or an alkyl or alkoxy group which may have a substituent, Rc and Rd each independently represents a halogen atom or an alkyl or aryl group which may have a substituent, Rc and Rd may combine to form an aromatic ring, a monocyclic ring or a polycyclic hydrocarbon ring (these rings each may contain an oxygen atom or a nitrogen atom), $Y_1$ and $Y_2$ each represents a carbon atom, the $Y_1$—$Y_2$ bond may be a single bond or a double bond, $X^-$ represents an anion of a carboxylic acid compound shown by the following formula, and $X_1$ and $X_2$ each independently represents a compound where the carboxyl group moiety of a carboxylic acid compound shown by the following formula is changed to an ester group:

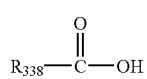

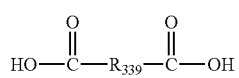

wherein $R_{338}$ represents a linear, branched or cyclic alkyl group having from 1 to 30 carbon atoms (the alkyl group may contain in the chain thereof an oxygen atom or a nitrogen atom), a linear, branched or cyclic alkenyl group having from 1 to 20 carbon atoms, a linear, branched or cyclic alkynyl group having from 1 to 20 carbon atoms, a linear, branched or cyclic alkoxyl group having from 1 to 20 carbon atoms, a group where at least a part of the hydrogen atom in the above-described alkyl group is substituted by a halogen atom and/or a hydroxyl group, a group where at least a part of the hydrogen atom in the above-described alkenyl group is substituted by a halogen atom and/or a hydroxyl group, or a substituted or unsubstituted aryl group having from 6 to 20 carbon atoms (examples of the aryl group include an alkyl group, a nitro group, a hydroxyl group, an alkoxy group, an acyl group, an alkoxycarbonyl group and a halogen atom), $R_{339}$ represents a single bond, a linear, branched or cyclic alkylene group having from 1 to 20 carbon atoms (the alkylene group may contain in the chain thereof an oxygen atom or a nitrogen atom), a linear, branched or cyclic alkenylene group having from 1 to 20 carbon atoms, a group where at least a part of the hydrogen atom in the above-described alkylene group is substituted by a halogen atom and/or a hydroxyl group, a group where at least a part of the hydrogen atom in the above-described alkenylene group is substituted by a halogen atom, or an alkoxyalkylene group having from 2 to 20 carbon atoms, $R_{338}$ present in a plural number or $R_{339}$ present in a plural number may be the same with or different from each other, $R_{340}$ represents a hydroxyl group or a halogen atom and $R_{340}$ present in a plural number may be the same with or different from each other, m, n, p and q each independently represents an integer of 0 to 3 satisfying the relationships of $m+n \leq 5$ and $p+q \leq 5$, and z represents 0 or 1.

In formulae (AI) to (AV), the linear or branched alkyl group of $R_{301}$ to $R_{337}$, Ra, Rb, Rc, Rd and $R_0$ includes a linear or branched alkyl group having from 1 to 4 carbon atoms, which may have a substituent, such as methyl group, ethyl group, propyl group, n-butyl group, sec-butyl group and tert-butyl group. The cyclic alkyl group includes a cyclic alkyl group having from 3 to 8 carbon atoms, which may have a substituent, such as cyclopropyl group, cyclopentyl group and cyclohexyl group.

The alkoxy group of $R_{301}$ to $R_{337}$, Ra and Rb includes an alkoxy group having from 1 to 4 carbon atoms, such as methoxy group, ethoxy group, hydroxyethoxy group, propoxy group, n-butoxy group, isobutoxy group, sec-butoxy group and tert-butoxy group.

The halogen atom of $R_{301}$ to $R_{337}$, Ra, Rb, Rc and Rd includes a fluorine atom, a chlorine atom, a bromine atom and an iodine atom.

The aryl group of $R_0$, Rc and Rd includes an aryl group having from 6 to 14 carbon atoms which may have a substituent, such as phenyl group, tolyl group, methoxyphenyl group and naphthyl group.

Preferred examples of the substituent include an alkoxy group having from 1 to 4 carbon atoms, a halogen atom (e.g., fluorine, chlorine, iodine), an aryl group having from 6 to 10 carbon atoms, an alkenyl group having from 2 to 6 carbon atoms, a cyano group, a hydroxy group, a carboxy group, an alkoxycarbonyl group and a nitro group.

The aromatic ring, monocyclic ring or polycyclic hydrocarbon ring (these rings each may contain an oxygen atom or a nitrogen atom) formed after Rc and Rd are combined includes a benzene structure, a naphthalene structure, a cyclohexane structure, a norbornene structure and an oxabicyclo structure.

The sulfonium or iodonium compound represented by formulae (AI) to (AIII) for use in the present invention contains, as the counter anion $X^-$, an anion (—COO$^-$) formed from a carboxyl group (—COOH) of at least one compound out of the carboxylic acid compounds represented by formulae (C1) to (C10).

The compound represented by formulae (AIV) to (AV) for use in the present invention contains, as the substituents $X_1$ and $X_2$, a substituent resulting from the conversion of the carboxyl group (—COOH) of at least one compound out of the carboxylic acid compounds represented by formula (C1) to (C10) into an ester group (—COO—).

The linear, branched or cyclic alkyl group having from 1 to 30 carbon atoms (the alkyl group may contain an oxygen atom or a nitrogen atom in the chain thereof) of $R_{338}$ includes methyl, ethyl, propyl, butyl, pentyl, hexyl, cyclohexyl, dodecyl, 1-ethoxyethyl and adamantyl.

The linear, branched or cyclic alkenyl group having from 1 to 20 carbon atoms includes ethenyl, propenyl, isopropenyl and cyclohexene.

The linear, branched or cyclic alkynyl group having from 1 to 20 carbon atoms includes acetylene and propenylene.

The linear, branched or cyclic alkoxy group having from 1 to 20 carbon atoms includes methoxy, ethoxy, propyloxy, butoxy, cyclohexyloxy, isobutoxy and dodecyloxy.

The substituted or unsubstituted aryl group having from 6 to 20 carbon atoms includes phenyl, naphthyl and anthranyl.

Examples of the substituent of the aryl group include an alkyl group, a nitro group, a hydroxyl group, an alkoxy group, an acyl group, an alkoxycarbonyl group and a halogen atom.

The linear, branched or cyclic alkylene group having from 1 to 20 carbon atoms (the alkylene group may contain an oxygen atom or a nitrogen atom in the chain thereof) of $R_{339}$ includes methylene, ethylene, propylene, butylene, isobutylene, ethoxyethylene and cyclohexylene.

The linear, branched or cyclic alkenylene group having from 1 to 20 carbon atoms includes vinylene and allylene.

Specific examples are set forth below, however, the present invention is not limited thereto.

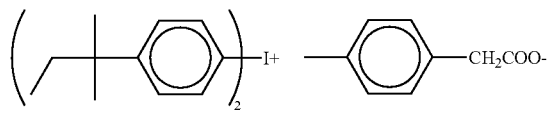
(I-1)

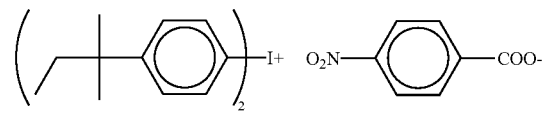
(I-2)

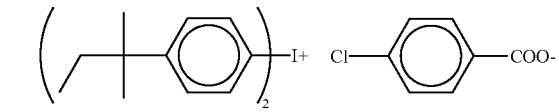
(I-3)

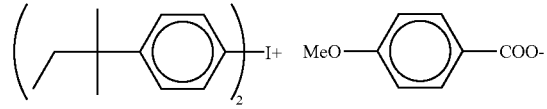
(I-4)

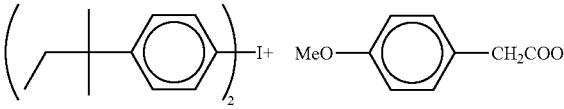
(I-5)

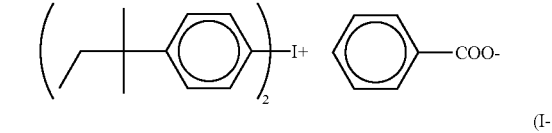
(I-6)

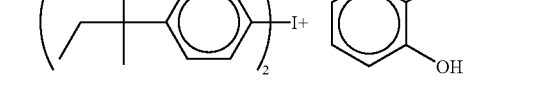
(I-7)

-continued
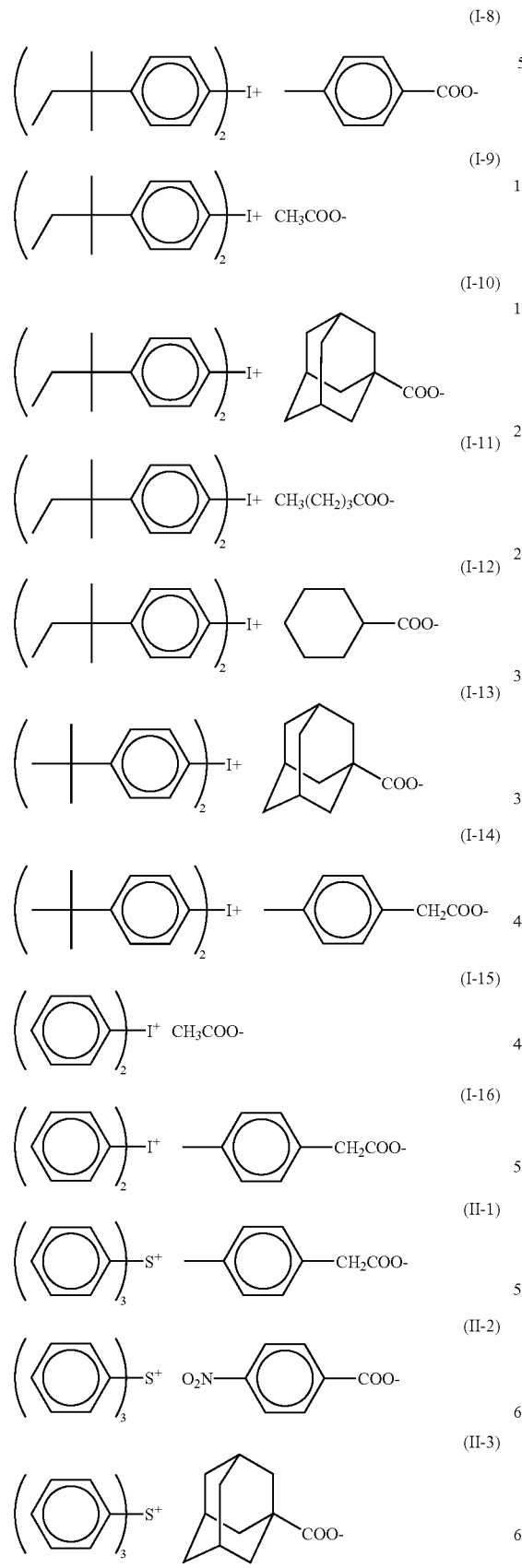
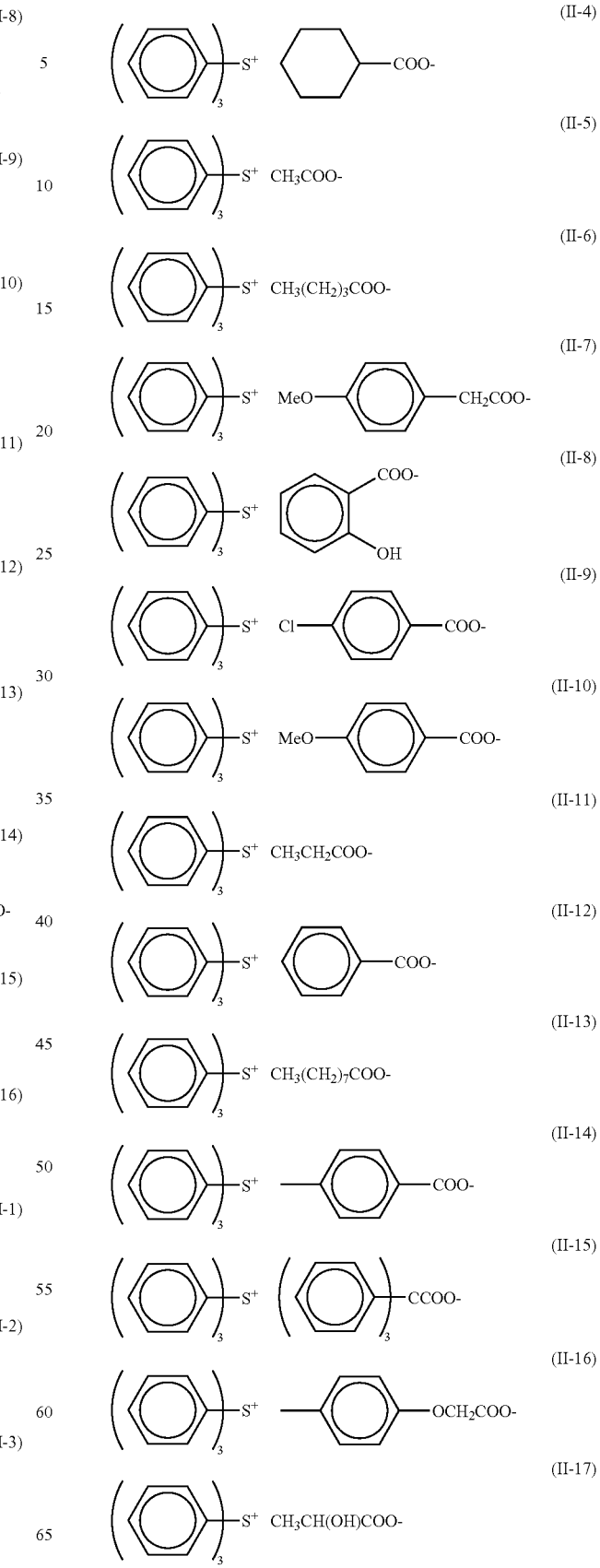

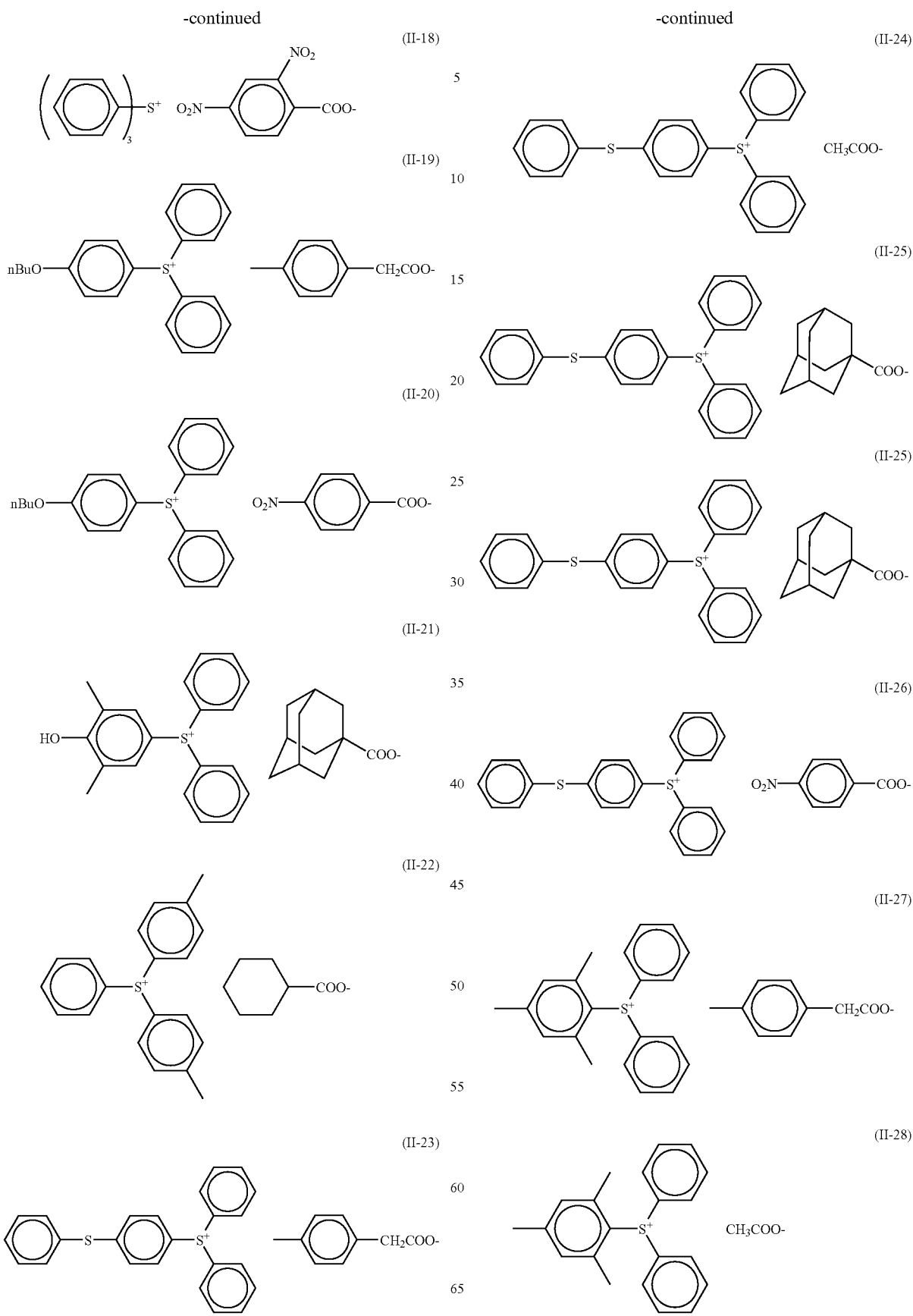

-continued
(II-29)
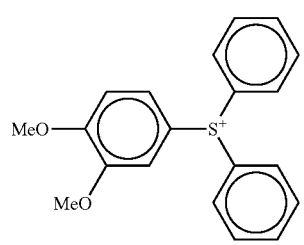 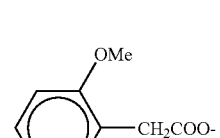
(II-30)
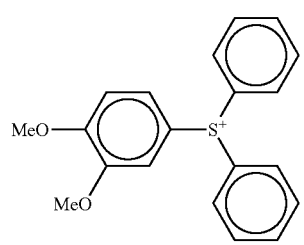 
(II-31)
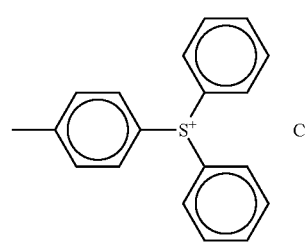 
(II-32)
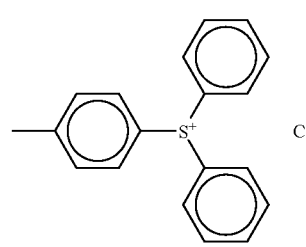 
(II-33)
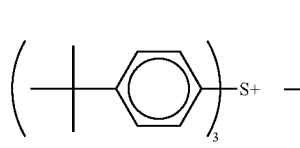 
(II-34)
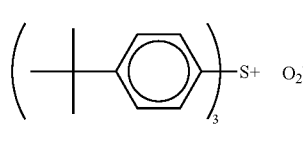 
(II-35)
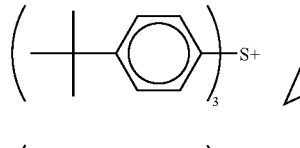 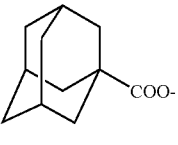
(II-36)
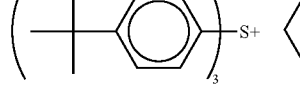 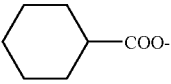
-continued
(II-37)
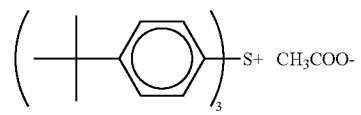
(II-38)
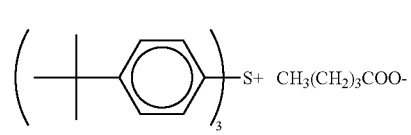
(II-39)
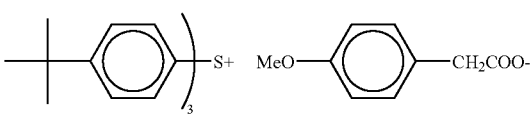
(II-40)
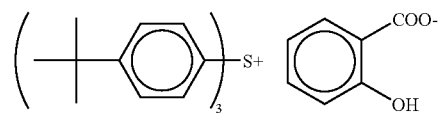
(II-41)
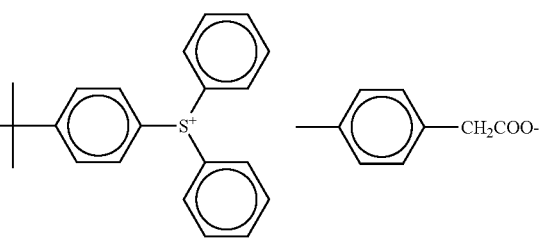
(II-41)
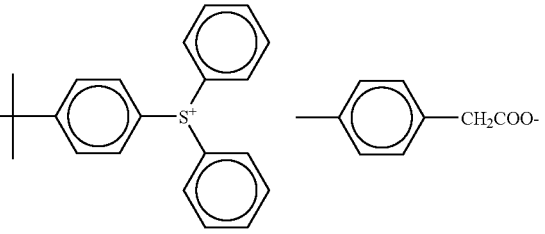
(II-42)
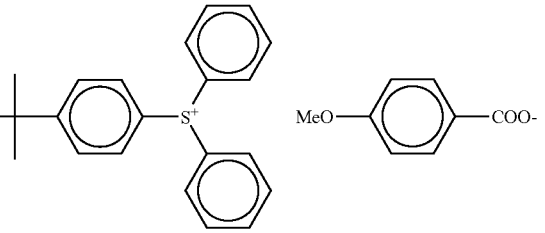
(II-43)
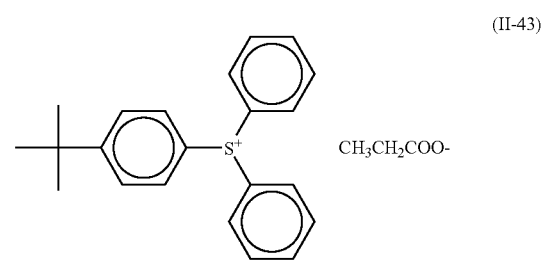

(II-44)
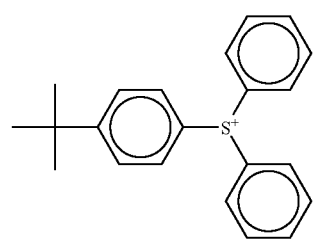
(II-45)
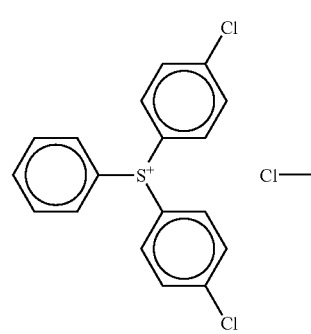
(II-46)
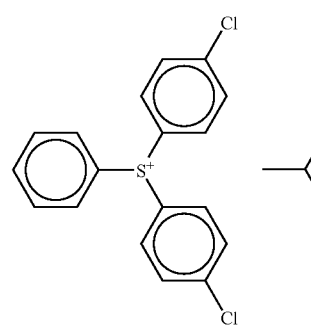
(II-47)
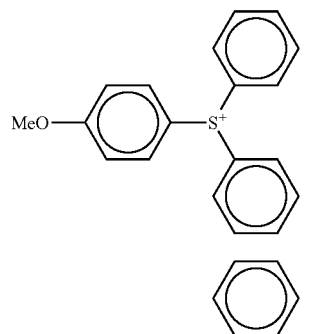
(II-48)
(III-1)
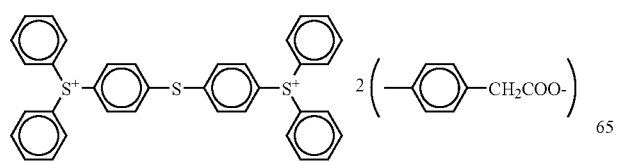
(III-2)
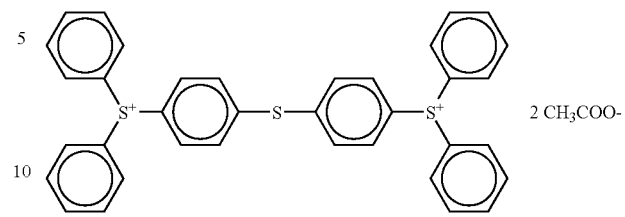
(IV-1)
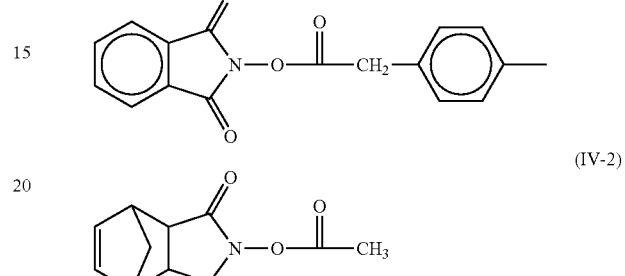
(IV-2)
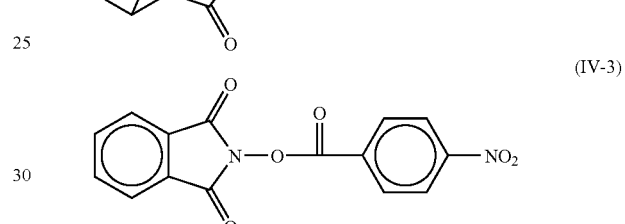
(IV-3)
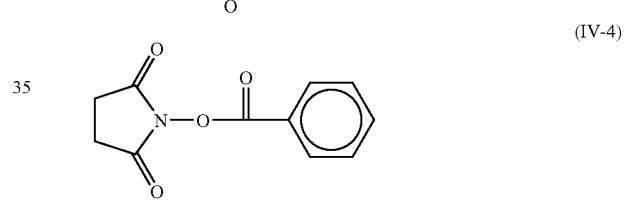
(IV-4)
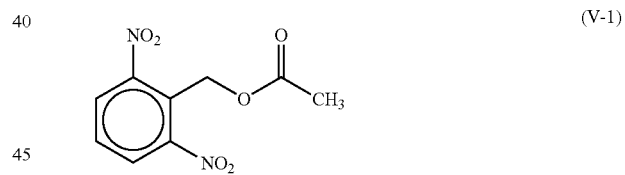
(V-1)
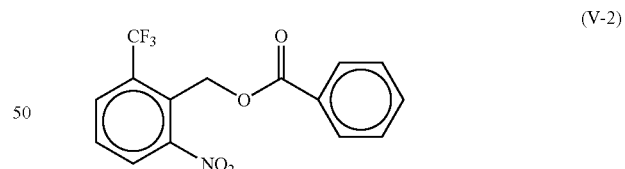
(V-2)
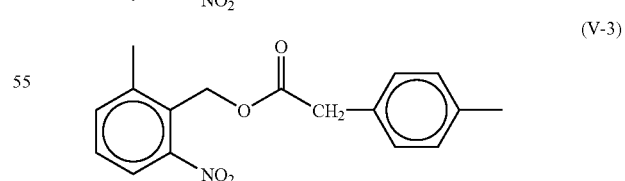
(V-3)
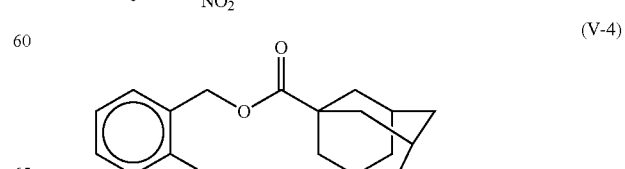
(V-4)

The above-described photoacid generators, namely, the compounds represented by formulae (AI), (AII) and (AIII) can be synthesized by using a method described in U.S. Pat. No. 3,734,928, *Macromolecules*, Vol. 10, 1307 (1977), *Journal of Organic Chemistry*, Vol. 55, 4222 (1990) and *J. Radiat. Curing*, Vol. 5(1), 2 (1978), and further exchanging the counter anion. The compounds represented by formulae (AIV) and (AV) can be obtained by reacting an N-hydroxyimide compound and carboxylic acid chloride under basic conditions or by reacting nitrobenzyl alcohol and carboxylic acid chloride under basic conditions.

The weight ratio of the component B1 and the component B2 added is usually from 1/1 to 50/1, preferably from 1/1 to 10/1, more preferably from 2/1 to 5/1.

The total amount of the components B1 and B2 is usually from 0.5 to 20 wt %, preferably from 0.75 to 15 wt %, more preferably from 1 to 10 wt %, based on the entire solid content of the composition.

For each of the component B1 and the component B2, a plurality of compounds may be contained.

[3] Surfactant as (C) of the Present Invention

The composition of the present invention may contain a surfactant and preferably contains a fluorine-containing and/or a silicon-containing surfactant. More specifically, the composition of the present invention contains any one of a fluorine-containing surfactant, a silicon-containing surfactant and a surfactant containing both fluorine atom and silicon atom, or contains two or more thereof.

Examples of the surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat Nos. 5,405,720, 5,360,692, 5,529,881, 5,296,330, 5,436,098, 5,576,143, 5,296,143, 5,294,511 and 5,824,451. Also, the commercially available surfactants described below each may be used as it is.

Examples of the commercially available surfactant include fluorine-containing surfactants and silicon-containing surfactants, such as EFtop EF301, EF303 and EF352 (produced by Shin-Akita Kasei K.K.), Florad FC430 and 431 (produced by Sumitomo 3M Inc.), Megafac F171, F173, F176, F189 and R08 (produced by Dainippon Ink & Chemicals, Inc.), Asahi Guard AG710 and Surflon S-382, SC101, 102, 103, 104, 105 and 106 (produced by Asahi Glass Co., Ltd.), and Toroysol S-366 (produced by Toroy Chemical). Also, polysiloxane polymer KP-341 (produced by Shin-Etsu Chemical Co., Ltd.) may be used as the silicon-containing surfactant.

The amount of the surfactant blended is usually from 0.001 to 2 wt %, preferably from 0.01 to 1 wt %, based on the solid content in the composition of the present invention. These surfactants may be used either individually or in combination of several surfactants.

[4] Acid Diffusion Inhibitor

In the composition of the present invention, an acid diffusion inhibitor is preferably added so as to prevent fluctuation in performance (formation of T-top shape of pattern, change in sensitivity, change in line width of pattern) due to aging after the irradiation of actinic rays or radiation until the heat treatment, fluctuation in performance due to aging after coating, and excessive diffusion of acid (deterioration of resolution) at the heat treatment after the irradiation of actinic rays or radiation.

The acid diffusion inhibitor is an organic basic compound, for example, an organic base compound containing nitrogen, and a compound where the pKa value of the conjugate acid is 4 or more is preferably used.

Specific examples thereof include the following structures (A) to (E).

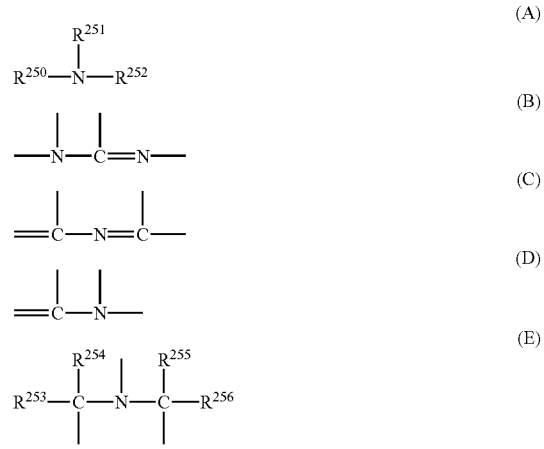

wherein $R^{250}$, $R^{251}$ and $R^{252}$ may be the same or different and each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, and $R^{251}$ and $R^{252}$ may be combined with each other to form a ring, and $R^{253}$, $R^{254}$, $R^{255}$ and $R^{256}$ may be the same or different and each represents an alkyl group having from 1 to 6 carbon atoms.

The compound is more preferably a nitrogen-containing basic compound having two or more nitrogen atoms different in the chemical environment within one molecule, still more preferably a compound containing both a substituted or unsubstituted amino group and a nitrogen atom-containing ring structure or a compound having an alkylamino group.

Specific preferred examples thereof include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, an imidazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Particularly preferred examples of the compound include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine, however, the present invention is not limited thereto.

These nitrogen-containing basic compounds are used individually or in combination of two or more thereof.

The ratio of the acid generator and the organic basic compound used in the composition is preferably (acid generator)/(organic basic compound) (molar ratio)=2.5 to 300. If this molar ratio is less than 2.5, the sensitivity is low and the resolution may decrease, whereas if it exceeds 300, the thickening of the resist pattern increased in aging after exposure until heat treatment and the resolution may decrease. The (acid generator)/(organic basic compound) (molar ratio) is more preferably from 5.0 to 200, still more preferably from 7.0 to 150.

[5] (C) Solvent

The composition of the present invention is dissolved in a solvent capable of dissolving the above-described components and then coated on a support. The solvent used here is preferably ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monoethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone or tetrahydrofuran. These solvents are used individually or in combination.

In the production or the like of a precision integrated circuit device, the step of forming a pattern on a resist film is performed by coating the composition of the present invention on a substrate (for example, silicon/silicon dioxide-coated transparent substrate such as glass substrate and ITO substrate), irradiating actinic rays or radiation using an actinic ray or radiation image drawing apparatus, and then subjecting the resist film to heating, development, rinsing and drying, whereby a good resist pattern can be formed.

The developer which can be used for the composition of the present invention is an aqueous solution of alkalis including an inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimetylethanolamine and triethanolamine, quaternary ammonium salts such as tetramethylammonium hydroxide and tetraethylammonium hydroxide, and cyclic amines such as pyrrole and piperidine.

Furthermore, to this aqueous solution of alkalis, an alcohol such as isopropyl alcohol and a surfactant such as nonionic surfactant may be added each in an appropriate amount.

Among these developers, preferred are quaternary ammonium salts, more preferred are tetramethylammonium hydroxide and choline.

EXAMPLES

The present invention is described in greater detail below by referring to Examples, however, the present invention should not be construed as being limited thereto.

<Synthesis of Resins (1) to (10)>

Resins (1) to (10) were synthesized by a method according to the method described in International Patent Publication WO00/17712.

The structure, molar ratio and weight average molecular weight of Resins (1) to (10) are shown below. In the molar ratio, repeating units are shown in the order from the left.

| | | Molar Ratio | Weight Average Molecular Weight |
|---|---|---|---|
| Resin (1) | 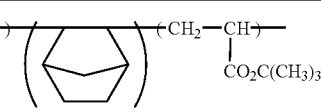 | (40/40/20) | 8500 |
| Resin (2) | 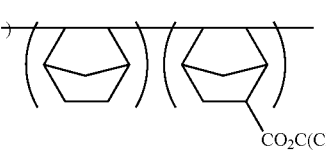 | (40/40/20) | 14500 |
| Resin (3) | 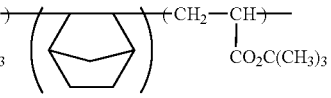 | (40/40/20) | 12500 |

-continued

| | | Molar Ratio | Weight Average Molecular Weight |
|---|---|---|---|
| Resin (4) | structure with -(CF$_2$-CF(CF$_3$))- , adamantyl with CO$_2$C(CH$_3$)$_3$, -(CH$_2$-CH(OC$_2$H$_5$))- | (40/40/20) | 16500 |
| Resin (5) | structure with -(CF$_2$-CF(CF$_3$))-, adamantyl with F$_3$C and CO$_2$C(CH$_3$)$_3$, -(CH(CH$_3$)-CH(OC$_2$C(CH$_3$)$_3$))- | (40/20/40) | 9500 |
| Resin (6) | structure with -(CF$_2$-CF)-, adamantyl, -(CH$_2$-CH(CO$_2$C(CH$_3$)$_3$))- with adamantyl | (40/40/20) | 15000 |
| Resin (7) | -(CF$_2$-CF(CF$_3$))-(CH$_2$-CH(O-CH$_2$CH$_2$O-C(=O)-C(CF$_3$)(norbornyl)))-(CH$_2$-C(CH$_3$)(CO$_2$-adamantyl))- | (50/30/20) | 16500 |
| Resin (8) | -(CF$_2$-CF(CF$_3$))-(CH$_2$-CH(O-CH$_2$CH$_2$O-C(CF$_3$)$_2$-cyclohexyl))-(CH$_2$-C(CH$_3$)(CO$_2$-(1-methylcyclohexyl)))- | (50/30/20) | 8900 |
| Resin (9) | -(CF$_2$-CF$_2$)- , adamantyl, -(CH$_2$-C(CF$_3$)(CO$_2$-adamantyl))- | (30/40/30) | 15000 |
| Resin (10) | -(CF$_2$-CF(CF$_3$))- , oxygen-containing bicyclic, -(CH$_2$-C(F)(CO$_2$-adamantyl))- | (30/40/30) | 18600 |

<Synthesis of Triphenylsulfonium Nonafluorobutane-sulfonate (VII-4)>

In 500 ml of methanol, 20 g of triphenylsulfonium iodide was dissolved. Thereto, 12.5 g of silver oxide was added and stirred at room temperature for 4 hours. The reaction solution was filtered to remove the silver compound and to this solution, 14.9 g of nonafluorobutanesulfonic acid was added. The resulting solution was concentrated and to the obtained oily product, 300 ml of diisopropyl ether was added and thoroughly stirred. Thereafter, an operation of removing diisopropyl ether by decantation was repeated twice. The obtained oily product was dried under reduced pressure, as a result, 18 g of the objective compound was obtained.

<Synthesis of Triphenylsulfonium 4-Dodecylbenzene-sulfonate (PAG4-1)>

In 500 ml of methanol, 10 g of triphenylsulfonium iodide was dissolved. Thereto, 4.44 g of silver oxide was added and stirred at room temperature for 4 hours. The reaction solution was filtered to remove the silver compound and to this solution, 4.67 g of 4-dodecylbenzenesulfonic acid was added. The resulting solution was concentrated and to the obtained oily product, 300 ml of diisopropyl ether was added and thoroughly stirred. Thereafter, an operation of removing diisopropyl ether by decantation was repeated twice. The obtained oily product was dried under reduced pressure, as a result, 6 g of the objective compound was obtained.

<Synthesis of Triphenylsulfonium Nonafluoropentanoate (II-4f)>

In 500 ml of methanol, 20 g of triphenylsulfonium iodide was dissolved. Thereto, 12.5 g of silver oxide was added and stirred at room temperature for 4 hours. The reaction solution was filtered to remove the silver compound and to this solution, 14.9 g of nonafluoropentanoic acid was added. The resulting solution was concentrated and to the obtained oily product, 300 ml of diisopropyl ether was added and thoroughly stirred. Thereafter, an operation of removing diisopropyl ether by decantation was repeated twice. The obtained oily product was dried under reduced pressure, as a result, 18 g of the objective compound was obtained.

Examples 1 to 10 and Comparative Examples 1 to 3

A polymer solution obtained by dissolving 1.2 g of the component A, 0.024 g of the component B1, 0.006 g of the component B2, 100 ppm of the component D based on the polymer solution, and 0.0012 g of the component E, in 19.6 g of the component C, as shown in Table 1 below, was filtered through a 0.1-μm Teflon filter to prepare a positive photoresist solution.

TABLE 1

|  | Component (A), Resin | Component (B1) | Component (B2) | Component (C) (weight ratio) | Component (D), Surfactant | Component (E), Basic Compound |
|---|---|---|---|---|---|---|
| Example |  |  |  |  |  |  |
| 1 | (1) | (VII-4) | (PAG4-1) | S-2 | W-1 | (N-1) |
| 2 | (2) | (VII-14) | (PAG4-1) | S-2 | W-2 | (N-1) |
| 3 | (3) | (VII-24) | (PAG4-4) | S-2 | W-1 | (N-1) |
| 4 | (4) | (VII-36) | (PAG4-34) | S-2/S-3 (80/20) | W-1 | (N-2) |
| 5 | (5) | (VII-54) | (II-1f) | S-2 | N-1 | (N-3) |
| 6 | (6) | (VII-5) | (II-5f) | S-2/S-3 (90/10) | W-2 | (N-1) |
| 7 | (7) | (VII-4) | (PAG4-1) | S-2 | W-1 | (N-1) |
| 8 | (8) | (VII-14) | (PAG4-1) | S-2 | W-1 | (N-2) |
| 9 | (9) | (VII-14) | (PAG4-4) | S-2/S-3 (80/20) | W-1 | (N-2) |
| 10 | (10) | (VII-14) | (PAG4-4) | S-2/S-3 (80/20) | W-1 | (N-2) |
| Comparative Example 1 | (1) | (VII-14) | — | S-2 | W-1 | (N-1) |
| Comparative Example 2 | (2) | (PAG4-1) | — | S-2/S-3 (70/30) | W-1 | (N-1) |
| Comparative Example 3 | (1) | (VII-14) | — | S-2 | — | (N-1) |

The symbols in the Table denote the followings.
N-1: Hexamethylenetetramine
N-2: 1,5-Diazabicyclo[4.3.0]-5-nonene
N-3: 1,8-Diazabicyclo[5.4.0]-7-undecene
W-1: Megafac F176 (produced by Dainippon Ink & Chemicals, Inc.) (containing fluorine)
W-2: Megafac R08 (produced by Dainippon Ink & Chemicals, Inc.) (containing fluorine and silicon)
S-1: Ethyl lactate
S-2: Propylene glycol monomethyl ether acetate
S-3: Propylene glycol monomethyl ether The thus-prepared positive photoresist solutions each was uniformly coated on a silicon wafer having coated thereon an antireflection film (DUV42-6, produced by Brewer Science, Inc.), using a spin coater and heat-dried at 120° C. for 60 seconds to form a positive photoresist film having a thickness of 0.1 μm. This resist film was subjected to pattern exposure using a line-and-space mask by an ArF stepper and immediately after the exposure, heated on a hot plate at 110° C. for 90 seconds. Then, the resist film was developed with an aqueous 2.38% tetramethylammonium hydroxide solution at 23° C. for 30 seconds, rinsed with pure water for 30 seconds and dried.

The obtained pattern on the silicon wafer was evaluated on the resist performance according to the following methods.

Evaluations were performed as follows.

[Line Edge Roughness]

In the range of 5 μm of edge in the longitudinal direction of a line pattern, the distance from the base line where the edge should be present was measured at 50 points by a length measuring machine SEM (S-8840 manufactured by Hitachi, Ltd.). Then, the standard deviation was determined and 3σ was calculated. As the value is smaller, the performance is better.

[Development Time Dependency]

With an exposure amount for reproducing a dimension of a mask pattern for line-and-space of 150 nm by setting the development time to 30 seconds, the similar pattern was formed by setting the development time to 90 seconds. The dimension of the pattern was measured and the difference from 150 nm is shown.

The results of performance evaluation are shown in Table 2.

TABLE 2

| Example | Line Edge Roughness (nm) | Development Time Dependency (nm) |
| --- | --- | --- |
| 1 | 8.9 | 4.1 |
| 2 | 9.3 | 4.4 |
| 3 | 9.6 | 4.7 |
| 4 | 9.9 | 4.8 |
| 5 | 9.2 | 4.6 |
| 6 | 9.0 | 4.4 |
| 7 | 8.9 | 4.1 |
| 8 | 9.0 | 4.1 |
| 9 | 8.6 | 4.1 |
| 10 | 8.4 | 4.4 |
| Comparative Example 1 | 13.8 | 9.0 |
| Comparative Example 2 | 13.6 | 9.3 |
| Comparative Example 3 | 14.6 | 12.7 |

It is seen from the results in Table 2 that the compositions of the present invention are good with small line edge roughness and low development time dependency.

According to the present invention, a photosensitive resin composition improved in the problems of line edge roughness and development time dependency can be provided.

The entire disclosure of each and every foreign patent application from which the benefit of foreign priority has been claimed in the present application is incorporated herein by reference, as if fully set forth.

What is claimed is:

1. A photosensitive resin composition comprising:
   (A) a resin capable of decomposing by the action of an acid to increase solubility in an alkali developer, the resin having:
      a repeating unit represented by formula (IA) below; and
      a repeating unit containing an acid decomposable group and copolymerizable with the repeating unit represented by formula (IA);
   (B1) a compound capable of generating an aliphatic or aromatic sulfonic acid upon irradiation with actinic rays or radiation, in which the aliphatic or aromatic sulfonic acid is substituted by at least one fluorine atom;
   (B2) a compound capable of generating one of an aliphatic sulfonic acid, an aromatic sulfonic acid, an aliphatic carboxylic acid and an aromatic carboxylic acid upon irradiation with actinic rays or radiation, in which each of the aliphatic sulfonic acid and the aromatic sulfonic acid contains no fluorine atom;
   (C) a solvent:
   (D) a surfactant; and
   (E) a nitrogen-containing basic compound:

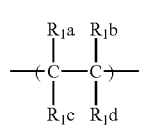

(IA)

wherein $R_1a$ to $R_1d$ each independently represents a hydrogen atom, a fluorine atom, an alkyl group, an alkyl group in which at least one hydrogen atom is substituted by a fluorine atom, a perfluoroalkyl group, a cycloalkyl group, an aryl group, —OR', —CO$_2$R' or —CONHR', R' represents an alkyl group, an alkyl group in which at least one hydrogen atom is substituted by a fluorine atom, a perfluoroalkyl group, a cycloalkyl group, an aryl group or an aralkyl group, and at least one of $R_1a$ to $R_1d$ represents a fluorine atom or an alkyl group in which at least one hydrogen atom is substituted by a fluorine atom, wherein the repeating unit represented by formula (IA) is selected from the group consisting of repeating units represented by the following formulae (I) to (III):

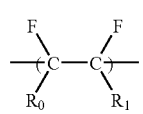

(I)

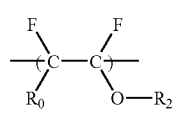

(II)

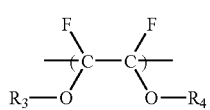

(III)

wherein $R_0$ and $R_1$ each independently represents a hydrogen atom, a fluorine atom, an alkyl group which may have a substituent, an alkyl group in which at least one hydrogen atom is substituted by a fluorine atom, which may have a substituent, a perfluoroalkyl group which may have a substituent, a cycloalkyl group which may have a substituent, or an aryl group which may have a substituent, $R_2$ to $R_4$ each independently represents an alkyl group in which at least one hydrogen atom is substituted by a fluorine atom, which may have a substituent, an alkyl group which may have a substituent, a cycloalkyl group which may have a substituent, or an aryl group which may have a substituent, and $R_0$ and $R_1$, $R_0$ and $R_2$, or $R_3$ and $R_4$ may combine to form a ring.

2. The photosensitive resin composition as described in claim 1, wherein the resin (A) is a resin capable of decomposing by the action of an acid to increase solubility in an alkali developer, the resin having:

the repeating unit represented by formula (IA); and a repeating unit represented by formula (IIA') below, in which the repeating unit contains an acid decomposable group and copolymerizable with the repeating unit represented by formula (IA):

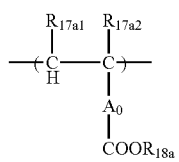

(IIA')

wherein $R_{17a1}$ and $R_{17a2}$, which may be the same or different, each represents a hydrogen atom, a halogen atom, a cyano group or an alkyl group which may have a substituent, $R_{18a}$ represents a hydrogen atom, $-C(R_{18a1})(R_{18a2})(R_{18a3})$ or $-C(R_{18a1})(R_{18a2})(OR_{18a4})$, wherein $R_{18a1}$ to $R_{18a4}$, which may be the same or different, each represents an alkyl, cycloalkyl, alkenyl, aralkyl or aryl group, each of which may have a substituent, and two of $R_{18a1}$, $R_{18a2}$ and $R_{18a3}$ or two of $R_{18a1}$, $R_{18a2}$ and $R_{18a4}$ may combine to form a ring, $A_0$ represents a single bond or a divalent linking group which may have a substituent, and $A_0$ and $R_{17a1}$ may combine to form an alicyclic group.

3. The photosensitive resin composition as described in claim 1, wherein the resin (A) further comprises a repeating unit represented by formula (IIA):

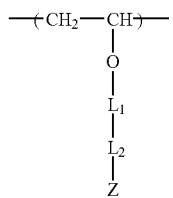

(IIA)

wherein Z represents an alkyl, aryl or aralkyl group, in which the alkyl, aryl or aralkyl group may have a substituent, $L_1$ represents a single bond or alkylene group, and $L_2$ represents a single bond, an alkylene group, —O—, —CO—, —CO$_2$—, —S—, —SO—, —SO$_2$— or a divalent group containing at least two of those groups, and when $L_1$ represents a single bond, $L_2$ represents a single bond or an alkylene group.

4. The photosensitive resin composition as described in claim 1, wherein the compound (B1) includes one of an iodonium salt represented by the following formula (PAG3) and a sulfonium salt represented by formula (PAG4):

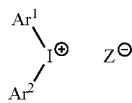

(PAG3)

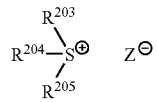

(PAG4)

wherein $Ar^1$ and $Ar^2$ each independently represents a substituted or unsubstituted aryl group, $R^{203}$, $R^{204}$ and $R^{205}$ each independently represents a substituted or unsubstituted alkly group or a substituted or unsubstituted aryl group, $Z^-$ represents a sulfonate anion having at least one fluorine atom, and two of $R^{203}$, $R^{204}$ and $R^{205}$, or $Ar^1$ and $Ar^2$ may combine through a single bond or a substituent.

5. The photosensitive resin composition as described in claim 1, wherein the weight ratio of the compound (B1) and the compound (B2) added is from 1/1 to 50/1.

6. A photosensitive resin composition comprising:

(A) a resin capable of decomposing by the action of an acid to increase solubility in an alkali developer, the resin having:

a repeating unit represented by formula (IA) below;

a repeating unit containing an acid decomposable group and copolymerizable with the repeating unit represented by formula (IA); and a repeating unit represented by formula (IIA) below;

(B1) a compound capable of generating an aliphatic or aromatic sulfonic acid upon irradiation with actinic rays or radiation, in which the aliphatic or aromatic sulfonic acid is substituted by at least one fluorine atom;

(B2) a compound capable of generating one of an aliphatic sulfonic acid, an aromatic sulfonic acid, an aliphatic carboxylic acid and an aromatic carboxylic acid upon irradiation with actinic rays or radiation, in which each of the aliphatic sulfonic acid and the aromatic sulfonic acid contains no fluorine atom;

(C) a solvent;

(D) a surfactant; and (E) a nitrogen-containing basic compound:

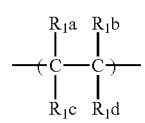

(IA)

wherein $R_1a$ to $R_1d$ each independently represents a hydrogen atom, a fluorine atom, an alkyl group, an alkyl group in which at least one hydrogen atom is substituted by a fluorine atom, a perfluoroalkyl group, a cycloalkyl group, an aryl group, —OR', —CO$_2$R' or —CONHR', R' represents an alkyl group, an alkyl group in which at least one hydrogen atom is substituted by a fluorine atom, a perfluoroalkyl group, a cycloalkyl group, an aryl group or an aralkyl group, and at least one of $R_1a$ to $R_1d$ represents a fluorine atom or an alkyl group in which at least one hydrogen atom is substituted by a fluorine atom,

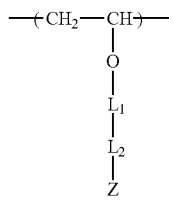
(IIA)

wherein Z represents an alkyl, aryl or aralkyl group, in which the alkyl, aryl or aralkyl group may have a substituent, $L_1$ represents a single bond or an alkylene group, and $L_2$ represents a single bond, an alkylene group, —O—, —CO—, —CO$_2$—, —S—, —SO—, —SO$_2$— or a divalent group containing at least two of those groups, and when $L_1$ represents a single bond, $L_2$ represents a single bond or an alkylene group.

7. The photosensitive resin composition as described in claim 6, wherein the resin (A) is a resin capable of decomposing by the action of an acid to increase solubility in an alkali developer, the resin having:
the repeating unit represented by formula (IA); and
a repeating unit represented by formula (IIA') below, in which the repeating unit contains an acid decomposable group and is copolymerizable with the repeating unit represented by formula (IA):

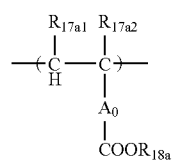
(IIA')

wherein $R_{17a1}$ and $R_{17a2}$, which may be the same or different, each represents a hydrogen atom, a halogen atom, a cyano group or an alkyl group which may have a substituent, and
$R_{18a}$ represents a hydrogen atom, —C($R_{18a1}$)($R_{18a2}$)($R_{18a3}$) or —C($R_{18a1}$)($R_{18a2}$)(O$R_{18a4}$), wherein $R_{18a1}$ to $R_{18a4}$, which may be the same or different, each represents an alkyl, cycloalkyl, alkenyl, aralkyl or aryl group, each of which may have a substituent, and two of $R_{18a1}$, $R_{18a2}$ and $R_{18a3}$ or two of $R_{18a1}$, $R_{18a2}$ and $R_{18a4}$ may combine to form a ring,
$A_0$ represents a single bond or a divalent linking group which may have a substituent, and $A_0$ and $R_{17a1}$ may combine to form an alicyclic group.

8. The photosensitive resin composition as described in claim 6, wherein the repeating unit represented by formula (IA) includes at least one of repeating units represented by the following formulae (I) to (III):

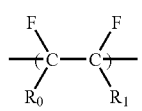
(I)

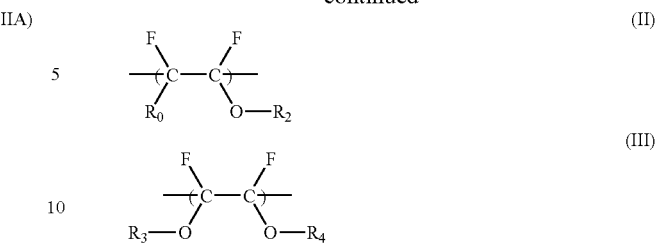

wherein $R_0$ and $R_1$ each independently represents a hydrogen atom, a fluorine atom, an alkyl group which may have a substituent, an alkyl group in which at least one hydrogen atom is substituted by a fluorine atom, which may have a substituent, a perfluoroalkyl group which may have a substituent, a cycloalkyl group which may have a substituent, or an aryl group which may have a substituent,
$R_2$ to $R_4$ each independently represents an alkyl group in which at least one hydrogen atom is substituted by a fluorine atom, which may have a substituent, an alkyl group which may have a substituent, a cycloakyl group which may have a substituent, or an aryl group which may have a substituent, and
$R_0$ and $R_1$, $R_0$ and $R_2$, or $R_3$ and $R_4$ may combine to form a ring.

9. The photosensitive resin composition as described in claim 6, wherein the compound (B1) includes one of an iodonium salt represented by the following formula (PAG3) and a sulfonium salt represented by formula (PAG4):

wherein $Ar^1$ and $Ar^2$ each independently represents a substituted or unsubstituted aryl group,
$R^{203}$, $R^{204}$ and $R^{205}$ each independently represents a substituted or unsubstituted alkyl group or a substituted or unsubstituted aryl group,
$Z^-$ represents a sulfonate anion having at least one fluorine atom, and
two of $R^{203}$, $R^{204}$ and $R^{205}$, or $Ar^1$ and $Ar^2$ may combine through a single bond or a substituent.

10. The photosensitive resin composition as described in claim 6, wherein the weight ratio of the compound (B1) and the compound (B2) added is from 1/1 to 50/1.

\* \* \* \* \*